(12) United States Patent
Cho et al.

(10) Patent No.: US 11,736,115 B2
(45) Date of Patent: Aug. 22, 2023

(54) ANALOG-DIGITAL CONVERTER AND OPERATING METHOD THEREOF

(71) Applicant: Samsung Electronics Co., Ltd., Suwon-si (KR)

(72) Inventors: Youngsea Cho, Seongnam-si (KR); Wan Kim, Hwaseong-si (KR); Jiseon Paek, Suwon-si (KR); Seunghyun Oh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 48 days.

(21) Appl. No.: 17/560,400

(22) Filed: Dec. 23, 2021

(65) Prior Publication Data
US 2022/0376698 A1 Nov. 24, 2022

(30) Foreign Application Priority Data

May 24, 2021 (KR) .......................... 10-2021-0066338

(51) Int. Cl.
*H03M 1/12* (2006.01)
*H03M 1/46* (2006.01)

(52) U.S. Cl.
CPC ......... *H03M 1/466* (2013.01); *H03M 1/1245* (2013.01)

(58) Field of Classification Search
CPC ........................... H03M 1/466; H03M 1/1245
USPC .................................. 341/155, 122, 144, 172
See application file for complete search history.

(56) References Cited

U.S. PATENT DOCUMENTS

| | | |
|---|---|---|
| 6,452,519 B1 | 9/2002 | Swanson |
| 6,864,821 B2 | 3/2005 | Yang |
| 7,015,853 B1 | 3/2006 | Wolff et al. |
| 7,154,423 B2 | 12/2006 | Kondo |
| 8,947,290 B2 | 2/2015 | Miki et al. |
| 9,912,347 B2 | 3/2018 | Takada et al. |
| 10,461,765 B2 | 10/2019 | Furubayashi et al. |
| 11,050,431 B1 * | 6/2021 | Ma ...................... H03M 1/0697 |
| 11,223,368 B1 * | 1/2022 | Prakash .............. H03M 1/0673 |

(Continued)

FOREIGN PATENT DOCUMENTS

| | | |
|---|---|---|
| KR | 10-2089872 B1 | 4/2020 |
| KR | 10-2123277 B1 | 6/2020 |
| WO | WO-2014/038197 A1 | 3/2014 |

OTHER PUBLICATIONS

Takuji Miki, et. al. "A 4.2 mW 50 MS/s 13 bit CMOS SAR ADC With SNR and SFDR enhancement Techniques" Journal of solid state circuit, vol. 50, No. 6, Jun. 2015.

*Primary Examiner* — Peguy Jean Pierre
(74) *Attorney, Agent, or Firm* — Harness, Dickey & Pierce, P.L.C.

(57) ABSTRACT

Provided are an analog-to-digital converter and/or an operating method thereof. The analog-to-digital converter includes a sample/hold circuit, a digital-to-analog converter, a comparing circuit, and a control logic circuit, wherein the digital-to-analog converter includes a first capacitor connected to a first comparison node and a first filtering node, a first reference voltage switch connected to the first filtering node and connected to a first delivery node or a first transmission node, a first pre-charge switch connected to the first filtering node or the first delivery node, and a first pre-charge capacitor connected to the first pre-charge switch and a ground voltage.

20 Claims, 23 Drawing Sheets

(56) References Cited

U.S. PATENT DOCUMENTS

2005/0261821 A1\* 11/2005 Abe .................. F02D 41/266
　　　　　　　　　　　　　　　　　　　　701/111
2012/0274489 A1\* 11/2012 Chang ................ H03M 1/462
　　　　　　　　　　　　　　　　　　　　341/110

\* cited by examiner

ANALOG-DIGITAL CONVERTER AND OPERATING METHOD THEREOF

CROSS-REFERENCE TO RELATED APPLICATION

This application is based on and claims priority under 35 U.S.C § 119 to Korean Patent Application No. 10-2021-0066338, filed on May 24, 2021, in the Korean Intellectual Property Office, the disclosure of which is incorporated by reference herein in its entirety.

BACKGROUND

Inventive concepts relate to an electronic device, and more particularly, to an analog-to-digital converter and/or an operating method thereof.

As a speed of a digital logic circuit is improved and/or power consumed by the digital logic circuit is rapidly reduced, competitiveness of a manufacturing process is improved. Therefore, research is being actively conducted into a successive approximation register analog-digital converters operating based on a digital circuit. However, the performance of a high-resolution successive approximation register analog-digital converter is limited by noise of a comparator and by switch noise of a digital-to-analog converter.

SUMMARY

Inventive concepts provide an analog-to-digital converter including a pre-charge capacitor charged in advance and/or an operating method thereof.

According to some example embodiments of inventive concepts, there is provided an analog-to-digital converter including a sample/hold circuit, a digital-to-analog converter, a comparing circuit, and a control logic circuit. The digital-to-analog converter includes a first capacitor connected to a first comparison node that is connected to a first input terminal of the comparing circuit, the first capacitor connected to a first filtering node, a first reference voltage switch configured to operate in response to a control of the control logic circuit to electrically connect the first filtering node to a first delivery node to which a first reference voltage is applied or to electrically connect the first filtering node to a first transmission node to which a second reference voltage is applied, a first pre-charge capacitor connected to a ground voltage, and a first pre-charge switch configured to operate in response to the control of the control logic circuit to connect the first pre-charge capacitor to one of the first filtering node or the first delivery node.

According to some example embodiments of inventive concepts, there is provided an analog-to-digital converter including a sample/hold driver configured to operate in response to a sample/hold control signal to sample first and second input voltages and output first and second sampling signals, digital-to-analog converter comprising a first sub digital-to-analog converter configured to operate in response to a first reference voltage switch control signal and a first pre-charge switch control signal so as to output a first target signal based on a first sampling signal, the digital-to-analog converter comprising a second sub digital-to-analog converter configured to operate in response to a second reference voltage switch control signal and a second pre-charge switch control signal so as to output a second target signal based on a second sampling signal, a comparator configured to operate in response to a comparison operation control signal to compare first and second target signals to each other and output a comparison result signal indicating a result of the comparison; and a controller configured to output the sample/hold control signal, first and second reference voltage switch control signals, first and second pre-charge switch control signals, and the comparison operation control signal, and to output the digital signal. The first sub digital-to-analog converter includes, a first reference voltage switch configured to provide a first reference voltage or a second reference voltage according to a logic level of the first reference voltage switch control signal, a first capacitor configured to receive a reference voltage provided from the first reference voltage switch and the first sampling signal, a first pre-charge switch configured to provide the first reference voltage or the reference voltage provided from the first reference voltage switch according to a logic level of the first pre-charge switch control signal, and a first pre-charge capacitor configured to receive a voltage provided from the first pre-charge switch and a ground voltage. The second sub digital-to-analog converter includes, a second reference voltage switch configured to provide the first reference voltage or the second reference voltage according to a logic level of the second reference voltage switch control signal, a second capacitor configured to receive a reference voltage provided from the second reference voltage switch and the second sampling signal, a second pre-charge switch configured to provide the first reference voltage or the reference voltage provided from the second reference voltage switch according to a logic level of the second pre-charge switch control signal, and a second pre-charge capacitor configured to receive a voltage provided from the second pre-charge switch and the ground voltage.

According to some example embodiments of inventive concepts, there is provided an operating method of an analog-to-digital converter including a sampling and pre-charging operation that samples the first and second input voltages, pre-charges a first pre-charge capacitor based on a first reference voltage, and pre-charges a second pre-charge capacitor based on a second reference voltage, a conversion operation that applies a sampled first input voltage and the first reference voltage to a first capacitor, applies a sampled second input voltage and the second reference voltage to a second capacitor, connects the first pre-charge capacitor to the first capacitor, connects the second pre-charge capacitor to the second capacitor, and provides a first target voltage based on the first capacitor and a second target voltage based on the second capacitor, a comparison operation that compares the first target voltage and the second target voltage with each other and generates a comparison result signal indicating a result of the comparison, and a controlling and determination operation that applies the first and second reference voltages to first and second capacitors and outputting the digital signal.

BRIEF DESCRIPTION OF THE DRAWINGS

Some example embodiments of inventive concepts will be more clearly understood from the following detailed description taken in conjunction with the accompanying drawings in which.

DETAILED DESCRIPTION OF SOME EXAMPLE EMBODIMENTS

Figure 1:
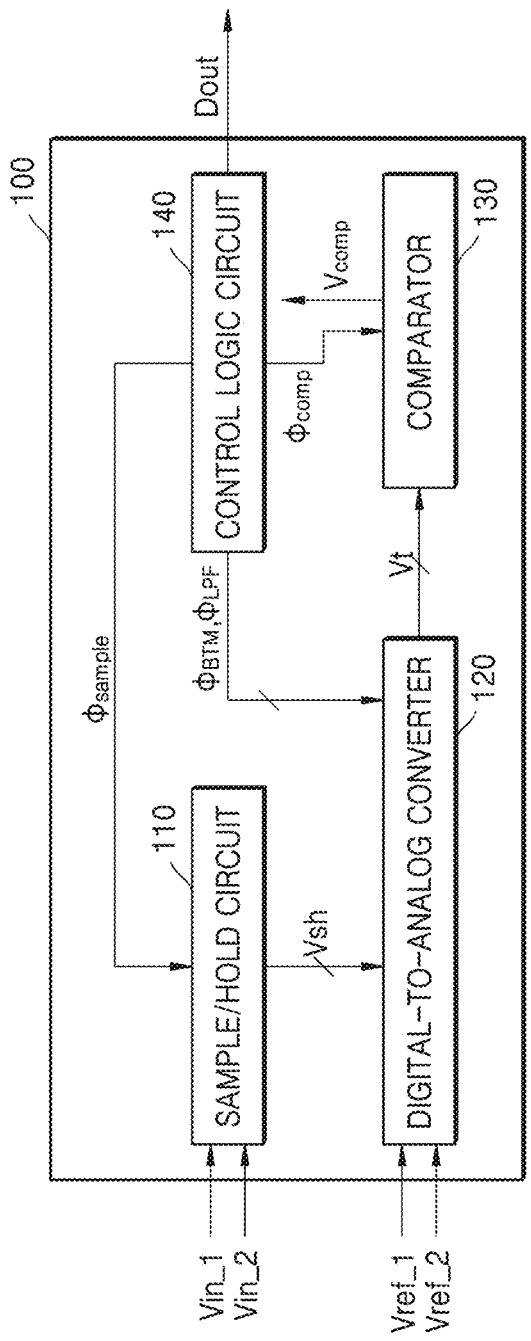
FIG. 1 is a diagram for describing an analog-to-digital converter according to some example embodiments of inventive concepts.

FIG. 1 is a diagram for describing an analog-to-digital converter according to some example embodiments of inventive concepts.

Referring to FIG. 1, an analog-to-digital converter 100 according to some example embodiments of inventive concepts may convert an analog signal into a digital signal Dout. In some example embodiments, the analog-to-digital converter 100 may be or may include a successive approximation register analog-digital converter.

The term "analog signal" used herein may also be referred to as "analog voltage" and/or "input voltage". The analog signal may be or may include a signal indicating particular information. The analog signal may be implemented as a differential signal. For example, the analog signal may be implemented as a signal corresponding to a difference between a first input voltage Vin_1 and a second input voltage Vin_2. The first input voltage Vin_1 and the second input voltage Vin_2 may be received through differential channels of the analog-to-digital converter 100. In some example embodiments, the first input voltage Vin_1 may be higher than (greater than) the second input voltage Vin_2. For example, the first input voltage Vin_1 may be a positive voltage higher than 0, whereas the second input voltage Vin_2 may be a negative voltage lower than 0. However, inventive concepts are not limited thereto.

The term "digital signal" used herein may also be referred to as "digital code". The digital signal Dout may be a signal having N bits.

The analog-to-digital converter 100 may receive a first reference voltage Vref_1 and a second reference voltage Vref_2 from the outside to convert an analog signal into the digital signal Dout. In some example embodiments, the first reference voltage Vref_1 may be higher than (greater than) the second reference voltage Vref_2. For example, the first reference voltage Vref_1 may be a positive voltage higher than 0, whereas the second reference voltage Vref_2 may be a negative voltage lower than 0. However, inventive concepts are not limited thereto.

The analog-to-digital converter 100 may be included in an electronic device. The electronic device may be or may include a communication device, a storage device, etc. The digital signal Dout may be output based on the first input voltage Vin_1, the second input voltage Vin_2, the first reference voltage Vref_1, and the second reference voltage Vref_2.

The analog-to-digital converter 100 may sequentially determine bit values from the most significant bit of the digital signal Dout to the least significant bit of the digital signal Dout and may determine the digital signal Dout approximated to the first input voltage Vin_1 and the second input voltage Vin_2. The analog-to-digital converter 100 may convert the first input voltage Vin_1 and the second input voltage Vin_2 into the digital signal Dout through a plurality of successive approximation cycles. The analog-to-digital converter 100 may determine an output logic value corresponding to one bit of the digital signal Dout per successive approximation cycle.

The analog-to-digital converter 100 may include a sample/hold circuit 110, a digital-to-analog converter 120, a comparator 130, and a control logic circuit 140.

The sample/hold circuit 110 may sample the first input voltage Vin_1 and the second input voltage Vin_2 in response to a sample/hold control signal Φsample. The sample/hold circuit 110 may output a sampling voltage Vsh corresponding to a sampled input voltage. In some example embodiments, because there are two types of input voltages, the sampling voltage Vsh may include a first sampling voltage and a second sampling voltage. The term "sample/hold circuit" used herein may also be referred to as "sample/hold driver", and the term "sampling voltage" used herein may also be referred to as "sampling signal".

The digital-to-analog converter 120 may receive sampling voltages Vsh (or sampling signals) output from the sample/hold circuit 110. The digital-to-analog converter 120 may output target signals Vt based on the sampling voltages Vsh in response to a plurality of reference voltage switch control signals ΦBTM and a plurality of pre-charge switch control signals ΦLPF. For example, the digital-to-analog converter 120 may output a first target signal based on a first sampling signal in response to a first reference voltage switch control signal and a first pre-charge switch control signal. Additionally or alternatively, the digital-to-analog converter 120 may output a second target signal based on a second sampling signal in response to a second reference voltage switch control signal and a second pre-charge switch control signal. Detailed descriptions thereof will be given later with reference to FIGS. 2 to 4. The term "digital-analog conversion circuit" used herein may also be referred to as a "digital-to-analog converter".

In response to a comparing operation control signal Φcomp, the comparator 130 may compare the target signals Vt to each other and may output a comparison result signal Vcomp indicating a comparison result. The term "comparator" used herein may also be referred to as "comparing circuit". The comparing operation control signal Φcomp may be or correspond to a spherical wave or a sine wave or a square wave or a pulse wave having a constant period from a particular time point, and may have a duty ratio of 50:50; however, example embodiments are not limited thereto. The comparison result signal Vcomp may be or may correspond to a signal indicating a comparison logic value.

The control logic circuit 140 may control the overall operations of the analog-to-digital converter 100. In some example embodiments, the control logic circuit 140 may generate the sample/hold control signal Φsample, the reference voltage switch control signals ΦBTM, the pre-charge switch control signals ΦLPF, and the comparing operation control signal Φcomp. The control logic circuit 140 may control the digital-to-analog converter 120 according to the logic level of the comparison result signal Vcomp indicating a comparison logic value. Based on whether the logic level of the comparison result signal Vcomp satisfies a particular condition, the control logic circuit 140 may terminate an analog-digital conversion process and may determine an N-bit (N is a natural number equal to or greater than 1) digital signal Dout. The control logic circuit 140 may include a successive approximation register for storing the N-bit digital signal Dout. The control logic circuit 140 may generate the digital signal Dout by arranging digital values. The term "control logic circuit" used herein may also be referred to as "controller", "control logic", or "control circuit".

The sample/hold control signal Φsample, the reference voltage switch control signals ΦBTM, the pre-charge switch control signals ΦLPF, and the comparing operation control signal Φcomp may each have a first logic level or a second logic level. In some example embodiments, the first logic level may be higher than or greater than the second logic level. For example, the first logic level may be a logic high level, and the second logic level may be a logic low level. However, inventive concepts are not limited thereto.

A clock signal having a certain period may be input to the analog-to-digital converter 100, and the sample/hold circuit 110 and the control logic circuit 140 may each operate in synchronization with the clock signal, e.g. based on a rising edge and/or a falling edge of the clock signal.

Figure 2:
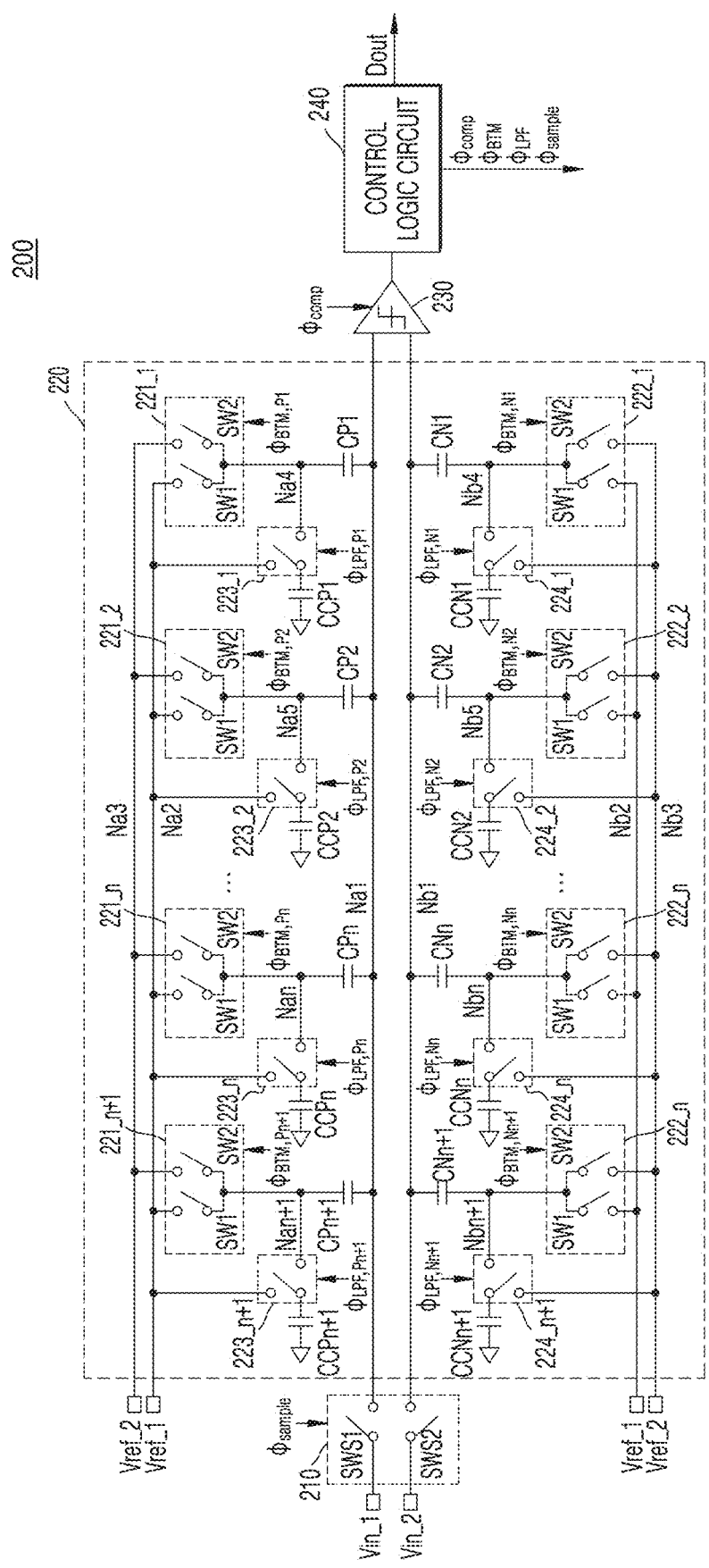
FIG. 2 is an equivalent circuit diagram of an analog-to-digital conversion circuit according to some example embodiments of inventive concepts.

FIG. 2 is an equivalent circuit diagram of an analog-to-digital conversion circuit according to some example embodiments of inventive concepts.

Referring to FIG. 2, an analog-to-digital converter 200 may include a sample/hold circuit 210, a digital-to-analog converter 220, a comparing circuit 230, and a control logic circuit 240.

In some example embodiments, the sample/hold circuit 210 may include a first sampling switch SWS1 and a second sampling switch SWS2. The first sampling switch SWS1 may input a first input voltage Vin_1 to a first comparing node Na1 according to the logic level of the sample/hold control signal Φsample. The second sampling switch SWS2 may input a second input voltage Vin_2 to a second comparing node Nb1 according to the logic level of the sample/hold control signal Φsample. In some example embodiments, the first sampling switch SWS1 and the second sampling switch SWS2 may be turned on and transfer the first input voltage Vin_1 and the second input voltage Vin_2 to the first comparing node Na1 and the second comparing node Nb1 when the sample/hold control signal Φsample has a first logic level. In some example embodiments, the first switching circuit SWS1 and/or the second switching circuit SWS2 are or include transistors such as NMOS transistors and/or PMOS transistors; however, example embodiments are not limited thereto.

In some example embodiments, the digital-to-analog converter 220 may include a first sub digital-to-analog converter and a second sub digital-to-analog converter.

The first sub digital-to-analog converter may include first to n+1-th capacitors CP1, CP2, CPn, and CP+1, first to n+1-th positive reference voltage switches 221_1, 221_2, 221_n, and 221_n+1, first to n+1-th positive pre-charge switches 223_1, 223_2, 223_n, and 223_n+1, and first to n+1-th pre-charge capacitors CCP1, CCP2, CCPn, and CCPn+1. Here, n may be a natural number equal to or greater than 2.

The first to n+1-th capacitors CP1, CP2, CPn, and CP+1 may each include a first terminal and a second terminal, and may be passive, linear transistors. First terminals of the first to n+1-th capacitors CP1, CP2, CPn, and CP+1 may be connected to the first comparing node Na1. Second terminals of the first to n+1-th capacitors CP1, CP2, CPn, and CP+1 may be connected to first to n+1-th positive filtering nodes Na4, Na5, NAn, and Nan+1, respectively. For example, the first terminal of the first capacitor CP1 may be connected to the first comparing node Na1, and the second terminal of the first capacitor CP1 may be connected to the first positive filtering node Na4. The first terminal of the second capacitor CP2 may be connected to the first comparing node Na1, and the second terminal of the second capacitor CP2 may be connected to the second positive filtering node Na5.

The first to n-th capacitors CP1, CP2, and CPn may be capacitors having binary weights, e.g. binary weights of capacitance, e.g. weights in a geometric ratio of 2:1. However, inventive concepts are not limited thereto, and the first to n-th capacitors CP1, CP2, and CPn may be capacitors having corresponding weights according to various switching techniques. For example, the capacitance of a particular capacitor corresponding to a particular bit of the digital signal Dout may be twice the capacitance of a capacitor corresponding to a less significant bit adjacent to the corresponding bit. For example, the capacitance of the first capacitor CP1 may be twice the capacitance of the second capacitor CP2. Meanwhile, the capacitance of an n-th capacitor CPn may be identical to the capacitance of an n+1-th capacitor CPn+1.

The first to n+1-th positive reference voltage switches 221_1, 221_2, 221_n, and 221_n+1 may provide the first reference voltage Vref_1 or the second reference voltage Vref_2 to the first to n+1-th capacitors CP1, CP2, CPn, and CP+1 according to logic levels of first to n+1 positive reference voltage switch control signals ΦBTM,P1, ΦBTM,P2, ΦBTM,Pn, and ΦBTM,Pn+1, respectively. For example, the first reference voltage Vref_1 may be provided to the first capacitor CP1 when the logic level of a first positive reference voltage switch control signal ΦBTM,P1 is a first logic level, and the second reference voltage Vref_2 may be provided to the first capacitor CP1 when the logic level of the first positive reference voltage switch control signal ΦBTM,P1 is a second logic level. Any or all of the first to n=1-th positive reference voltage switches 221_1, 221_2, 221_n, 221_n+1 may be or may include transistors, such as but not limited to NMOS transistors and/or PMOS transistors.

In some example embodiments, the first to n+1-th positive reference voltage switches 221_1, 221_2, 221_n, and 221_n+1 may each include a first switch SW1 and a second switch SW2. However, inventive concepts are not limited thereto. For example, when the logic level of the first positive reference voltage switch control signal ΦBTM,P1 is the first logic level, the first switch SW1 may be turned ON and the second switch SW2 may be turned OFF, and thus, a first delivery node Na2 and the first positive filtering node Na4 may be electrically connected to each other. Alternatively or additionally, when the logic level of the first positive reference voltage switch control signal ΦBTM,P1 is the second logic level, the first switch SW1 may be turned OFF and the second switch SW2 may be turned ON, and thus, a first transmission node Na3 and the first positive filtering node Na4 may be electrically connected to each other.

The first to n+1-th positive pre-charge switches 223_1, 223_2, 223_n, and 223_n+1 may provide the first reference voltage Vref_1 and/or voltages generated by the first to n+1-th positive filtering nodes Na4, Na5, NAn, and Nan+1 to the first to n+1-th pre-charge capacitors CCP1, CCP2, CCPn, and CCPn+1 according to logic levels of first to n+1-th positive pre-charge switch control signals ΦLPF,P1, ΦLPF,P2, ΦLPF,Pn, and ΦLPF,Pn+1. Here, the voltages generated by the first to n+1-th positive filtering nodes Na4, Na5, NAn, and Nan+1 may be reference voltages (the first reference voltage Vref_1 or the second reference voltage Vref_2) provided from the first to n+1-th positive reference voltage switches 221_1, 221_2, 221_n, and 221_n+1, respectively. For example, when the logic level of the first positive pre-charge switch control signal ΦLPF,P1 is the first logic level, the first pre-charge capacitor CCP1 may be electrically connected to the first delivery node Na2. Alternatively or additionally, when the logic level of the first positive pre-charge switch control signal ΦLPF,P1 is the second logic level, the first pre-charge capacitor CCP1 may be electrically connected to the first positive filtering node Na4.

The first to n+1-th pre-charge capacitors CCP1, CCP2, CCPn, and CCPn+1 may each include a first terminal and a second terminal, and may be two-terminal devices; however, example embodiments are not limited thereto. A ground voltage may be applied to first terminals of the first to n+1-th pre-charge capacitors CCP1, CCP2, CCPn, and CCPn+1. Voltages provided from the first to n+1-th positive pre-charge switches 223_1, 223_2, 223_n, and 223_n+1 may be applied to second terminals of the first to n+1-th pre-charge capacitors CCP1, CCP2, CCPn, and CCPn+1, respectively. For example, a first terminal of the first pre-charge capacitor CCP1 may be connected to a node to which a ground voltage is applied, and a second terminal of the first pre-charge capacitor CCP1 may be connected to the first positive pre-charge switch 223_1. The first pre-charge capacitor CCP1 may be electrically connected to the first delivery node Na2 or the first positive filtering node Na4 according to the operation of the first positive pre-charge switch 223_1.

The second sub digital-to-analog converter may include first to n+1-th capacitors CN1, CN2, CNn, and CNn+1, first to n+1-th negative reference voltage switches 222_1, 222_2, 222_n, and 222_n+1, first to n+1-th negative pre-charge switches 224_1, 224_2, 224_n, and 224_n+1, and first to n+1-th pre-charge capacitors CCN1, CCN2, CCNn, and CCNn+1. Here, n may be a natural number equal to or greater than 2.

First terminals of the first to n+1-th capacitors CN1, CN2, CNn, and CNn+1 may be connected to the second comparing node Nb1, and second terminals of the first to n+1-th capacitors CN1, CN2, CNn, and CNn+1 may be connected to first to n+1-th negative filtering nodes Nb4, Nb5, Nbn, and Nbn+1. For example, the first capacitor CN1 may be connected to the second comparing node Nb1 and the first negative filtering node Nb4. The second capacitor CN2 may be connected to the second comparing node Nb1 and the second negative filtering node Nb5.

The first to n+1-th negative reference voltage switches 222_1, 222_2, 222_n, and 222_n+1 may provide the first reference voltage Vref_1 or the second reference voltage Vref_2 to the first to n+1-th capacitors CN1, CN2, CNn, and CNn+1 according to logic levels of first to n+1-th negative reference voltage switch control signals ΦBTM,N1, ΦBTM,N2, ΦBTM,Nn, and ΦBTM,Nn+1, respectively. The first to n+1-th negative reference voltage switches 222_1, 222_2, 222_n, and 222_n+1 are similar to the first to n+1-th positive reference voltage switches 221_1, 221_2, 221_n, and 221_n+1, and may have the same or similar design and/or electrical properties. For example, when or if the logic level of a first negative reference voltage switch control signal ΦBTM,N1 is the first logic level, a second delivery node Nb2 and the first negative filtering node Nb4 may be electrically connected to each other. Alternatively, when the logic level of the first negative reference voltage switch control signal ΦBTM,N1 is the second logic level, a second transmission node Nb3 and the first negative filtering node Nb4 may be electrically connected to each other.

The first to n+1-th negative pre-charge switches 224_1, 224_2, 224_n, and 224_n+1 may provide the second reference voltage Vref_2 or voltages generated by the first to n+1-th negative filtering nodes Nb4, Nb5, Nbn, and Nbn+1 to the first to n+1-th pre-charge capacitors CCN1, CCN2, CCNn, and CCNn+1 according to logic levels of first to n+1-th negative pre-charge switch control signals ΦLPF,N1, ΦLPF,N2, ΦLPF,Nn, and ΦLPF,Nn+1, respectively. For example, when the logic level of a first negative pre-charge switch control signal ΦLPF,N1 is the first logic level, the first pre-charge capacitor CCN1 may be electrically connected to the second transmission node Nb3. Alternatively or additionally, when the logic level of the first negative pre-charge switch control signal ΦLPF,N1 is the second logic level, the first pre-charge capacitor CCN1 may be electrically connected to the first negative filtering node Nb4. Any or all of the first to n=1-th negative reference voltage switches 224_1, 224_2, 224_n, 221_n+1 may be or may include transistors, such as but not limited to NMOS transistors and/or PMOS transistors, and may be the same conductivity type, or different conductivity types, than any or all of the positive reference voltage switches 221_1, 221_2, 221_n, 221_n+1.

The first to n+1-th pre-charge capacitors CCN1, CCN2, CCNn, and CCNn+1 may each include a first terminal and a second terminal, and may be two-terminal devices; however, example embodiments are not limited thereto. A ground voltage may be applied to first terminals of the first to n+1-th pre-charge capacitors CCN1, CCN2, CCNn, and CCNn+1. Voltages provided from the first to n+1-th negative pre-charge switches 224_1, 224_2, 224_n, and 224_n+1 may be applied to second terminals of the first to n+1-th pre-charge capacitors CCN1, CCN2, CCNn, and CCNn+1, respectively.

The comparing circuit 230 may compare the voltage of the first comparing node Na1 with the voltage of the second comparing node Nb1 and may output a result of the comparison as a comparison result signal having a first result value or a second result value. In some example embodiments, the first result value may be a logic high level of 1, the second result value may be a logic low level of 0, or vice versa. In detail, the voltage of the first comparing node Na1 may be input to a first input end of the comparing circuit 230, and the voltage of the second comparing node Nb1 may be input to a second input end of the comparing circuit 230. In some example embodiments, when the voltage of the first comparing node Na1 is higher than/greater than the voltage of the second comparing node Nb1, the comparing circuit 230 may output the first result value, e.g., 1. Alternatively, when the voltage of the first comparing node Na1 is lower than/less than the voltage of the second comparing node Nb1, the comparing circuit 230 may output the second result value, e.g., 0.

The control logic circuit 240 may control the sample/hold circuit 210 to perform a sampling operation. In detail, the control logic circuit 240 may control the sample/hold circuit 210 by providing a sample/hold control signal Φsample having a first logic level or a second logic level to the sample/hold circuit 210.

The control logic circuit 240 may determine bits of the N-bit digital signal Dout according to a result value output by the comparing circuit 230 and, based on the result value, control any or all of the first to n+1-th positive reference voltage switches 221_1, 221_2, 221_n, and 221_n+1 and the first to n+1-th negative reference voltage switches 222_1, 222_2, 222_n, and 222_n+1. For example, in the case of determining the most significant bit of the N-bit digital signal Dout, the control logic circuit 240 may determine the most significant bit of the N-bit digital signal Dout as 0 in response to the first result value (e.g., 1). In this case, the control logic circuit 240 controls the first positive reference voltage switch 221_1 to electrically connect the first transmission node Na3 to the first positive filtering node Na4 and control the first negative reference voltage switch 222_1 to electrically connect the second delivery node Nb2 to the first negative filtering node Nb4.

The control logic circuit 240 may sequentially determine bits of the N-bit digital signal Dout from the most significant bit to the least significant bit, and, as an operation for determining a bit of the N-bit digital signal Dout is repeatedly performed, the N-bit digital signal Dout may be approximated.

In the case of an operation of converting an analog signal into the N-bit digital signal Dout, an operation of changing and comparing the voltage of the first comparing node Na1 to the voltage of the second comparing node Nb1 is repeatedly performed, and thus, output digital values approximated to the analog signal may be determined sequentially from the most significant bit of the N-bit digital signal Dout. Therefore, errors may be reduced, e.g. reduced in probability of and/or impact from occurring.

Hereinafter, an operating method of the analog-to-digital converter 200 will be described in detail.

FIGS. 3A to 3E are diagrams for describing an operating method of the analog-to-digital converter shown in FIG. 2. In the descriptions of circuit diagrams shown in FIGS. 3A to 3E, descriptions identical to those already given above are omitted, and descriptions below will focus on changes in connection relationships among circuits, devices, and/or nodes.

Figure 3A:
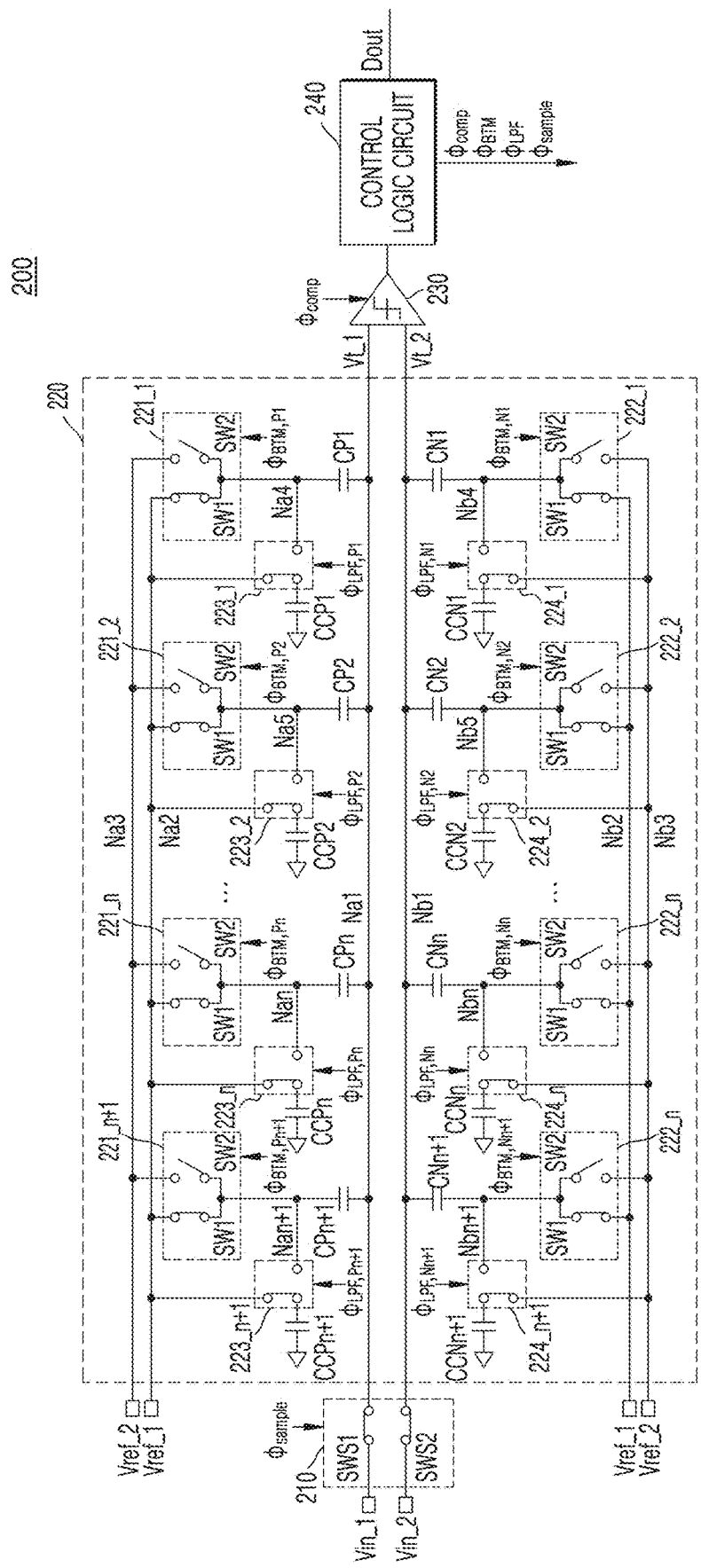
FIGS. 3A to 3E are diagrams for describing an operating method of the analog-to-digital converter shown in FIG. 2.

Referring to FIG. 3A, the circuit diagram shown in FIG. 3A shows an example of a first operation period of the analog-to-digital converter 200. During the first operation period, the analog-to-digital converter 200 may perform a sampling operation and a pre-charging operation.

The control logic circuit 240 may provide a sample/hold control signal Φsample having a first logic level to the sample/hold circuit 210. In this case, the first sampling switch SWS1 and the second sampling switch SWS2 are turned ON, and the first input voltage Vin_1 and the second input voltage Vin_2 may be applied to the first comparing node Na1 and the second comparing node Nb1.

The control logic circuit 240 may provide a plurality of reference voltage switch control signals ΦBTM to the digital-to-analog converter 220. In detail, the control logic circuit 240 may provide the first to n+1 positive reference voltage switch control signals ΦBTM,P1, ΦBTM,P2, ΦBTM,Pn, and ΦBTM,Pn+1 having the first logic level to the first to n+1-th positive reference voltage switches 221_1, 221_2, 221_n, and 221_n+1, respectively. Also, the control logic circuit 240 may provide the first to n+1-th negative reference voltage switch control signals ΦBTM,N1, ΦBTM,N2, ΦBTM,Nn, and ΦBTM,Nn+1 having the first logic level to the first to n+1-th negative reference voltage switches 222_1, 222_2, 222_n, and 222_n+1, respectively. The first to n+1-th positive filtering nodes Na4, Na5, NAn, and Nan+1 may each be electrically connected to the first delivery node Na2. The first to n+1-th negative filtering nodes Nb4, Nb5, Nbn, and Nbn+1 may each be electrically connected to the second delivery node Nb2. A first target voltage Vt_1 may be applied at the first comparing node Na1, and a second target voltage Vt_2 may be applied at the second comparing node Nb1.

The control logic circuit 240 may provide a plurality of pre-charge switch control signals ΦLPF to the digital-to-analog converter 220. In detail, the control logic circuit 240 may provide the first to n+1-th positive pre-charge switch control signals ΦLPF,P1, ΦLPF,P2, ΦLPF,Pn, and ΦLPF,Pn+1 having the first logic level to the first to n+1-th positive pre-charge switches 223_1, 223_2, 223_n, and 223_n+1, respectively. Also, the control logic circuit 240 may provide the first to n+1-th negative pre-charge switch control signals ΦLPF,N1, ΦLPF,N2, ΦLPF,Nn, and ΦLPF,Nn+1 having the first logic level to the first to n+1-th negative reference voltage switches 222_1, 222_2, 222_n, and 222_n+1, respectively. In this case, the first to n+1-th pre-charge capacitors CCP1, CCP2, CCPn, and CCPn+1 included in the first sub digital-to-analog converter may pre-charge an amount of charge that corresponds to a difference between the first reference voltage Vref_1 and the ground voltage. The first to n+1-th pre-charge capacitors CCN1, CCN2, CCNn, and CCNn+1 included in the second sub digital-to-analog converter may pre-charge an amount of charge that corresponds to a difference between the second reference voltage Vref_2 and the ground voltage.

The control logic circuit 240 may provide a comparing operation control signal Φcomp having the second logic level to the comparing circuit 230. In this case, the comparing circuit 230 may stand by without performing a comparison operation.

Figure 3B:
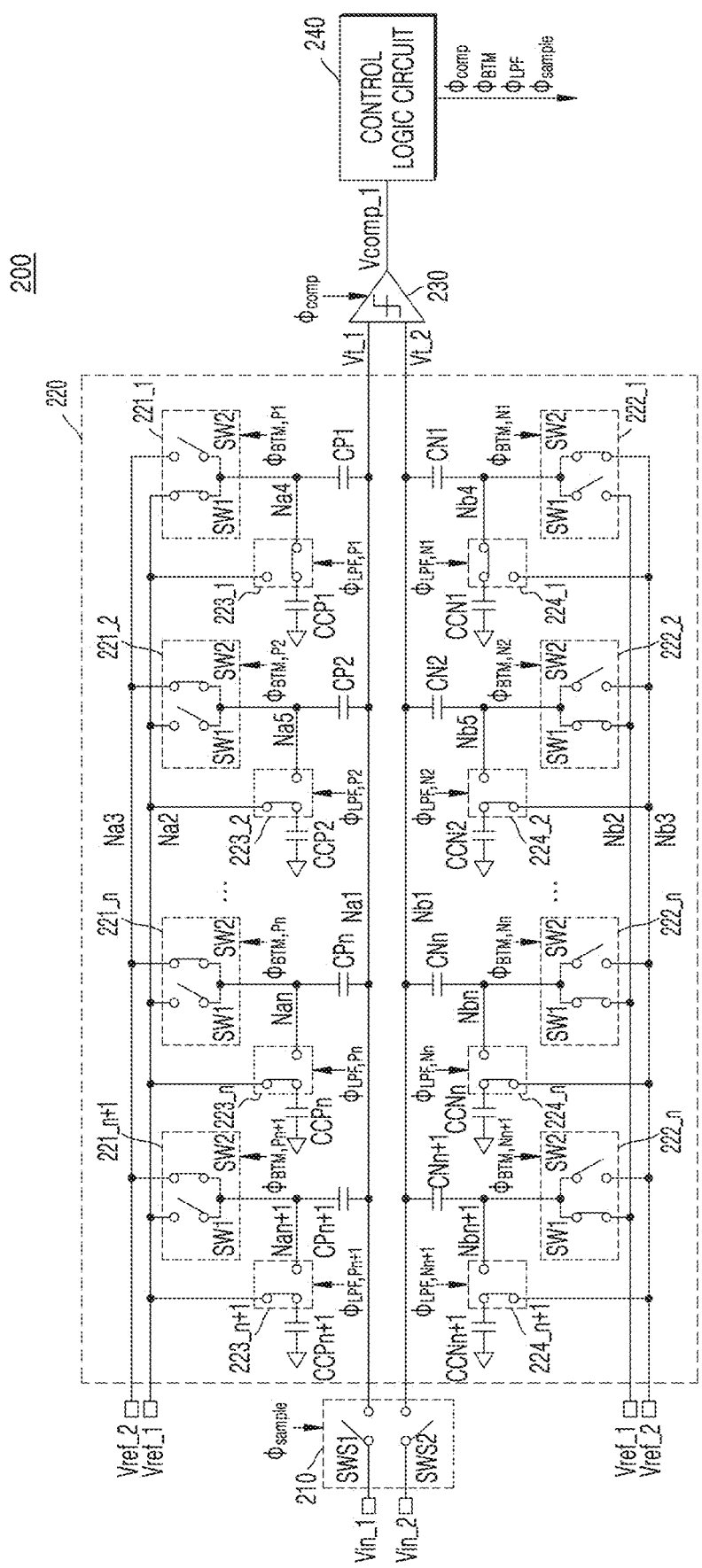

Referring to FIG. 3B, the circuit diagram shown in FIG. 3B shows an example of a second operation period of the analog-to-digital converter 200 subsequent to the first operation period. During the second operation period, the analog-to-digital converter 200 may hold sampled signals and perform a comparison operation for determining the most significant bit of the digital signal Dout.

The control logic circuit 240 may provide a sample/hold control signal Φsample having a second logic level to the sample/hold circuit 210. In this case, the first sampling switch SWS1 and the second sampling switch SWS2 may be turned OFF.

Th control logic circuit 240 may provide the first positive reference voltage switch control signal ΦBTM,P1 having the first logic level to the first positive reference voltage switch 221_1. Also, the control logic circuit 240 may provide second to n+1-th positive reference voltage switch control signals ΦBTM,P2, ΦBTM,Pn, and ΦBTM,Pn+1 having the second logic level to second to n+1-th positive reference voltage switches 221_2, 221_n, and 221_n+1. In this case, the connection relationship between the first positive filtering node Na4 and the first delivery node Na2 may be maintained, and second to n+1-th positive filtering nodes Na5, Nan, and Nan+1 may each be electrically connected to the first transmission node Na3.

Meanwhile, the control logic circuit 240 may provide the first negative reference voltage switch control signal ΦBTM,N1 having the second logic level to the first negative reference voltage switch 222_1. Also, the control logic circuit 240 may provide second to n+1-th negative reference voltage switch control signals ΦBTM,N2, ΦBTM,Nn, and ΦBTM,Nn+1 having the first logic level to second to n+1-th negative reference voltage switches 222_2, 222_n, and 222_n+1. The first negative filtering node Nb4 may be electrically connected to the second transmission node Nb3. The connection relationship between second to n+1-th negative filtering nodes Nb5, Nbn, and Nbn+1 and the second delivery node Nb2 may be maintained.

The control logic circuit 240 may provide the first positive pre-charge switch control signal ΦLPF,P1 having the second logic level to the first positive pre-charge switch 223_1. Also, the control logic circuit 240 may provide second to n+1-th positive pre-charge switch control signals ΦLPF,P2, ΦLPF,Pn, and ΦLPF,Pn+1 having the first logic level to second to n+1-th positive pre-charge switches 223_2, 223_n, and 223_n+1, respectively. In this case, the first positive filtering node Na4 may be electrically connected to the first pre-charge capacitor CCP1. In this case, an amount of charge that is pre-charged to the first pre-charge capacitor CCP1 connected to the first positive filtering node Na4 may be maintained.

Meanwhile, the control logic circuit 240 may provide the first negative pre-charge switch control signal ΦLPF,N1 having the second logic level to a first negative pre-charge switch 224_1. Also, the control logic circuit 240 may provide second to n+1-th negative pre-charge switch control signals ΦLPF,N2, ΦLPF,Nn, and ΦLPF,Nn+1 having the first logic level to second to n+1-th negative pre-charge switches 224_2, 224_n, and 224_n+1, respectively. In this case, the first negative filtering node Nb4 may be electrically connected to the first pre-charge capacitor CCN1. In this case, an amount of charge that is pre-charged to the first pre-charge capacitor CCN1 connected to the first negative filtering node Nb4 may be maintained.

The control logic circuit 240 may provide a comparing operation control signal Φcomp having pulses of the first logic level to the comparing circuit 230. In this case, while the comparing operation control signal Φcomp maintains the first logic level, the comparing circuit 230 may compare the first target voltage Vt_1 with the second target voltage Vt_2 and provide a first comparison result signal Vcomp_1 indicating a result of the comparison to the control logic circuit 240.

Figure 3C:
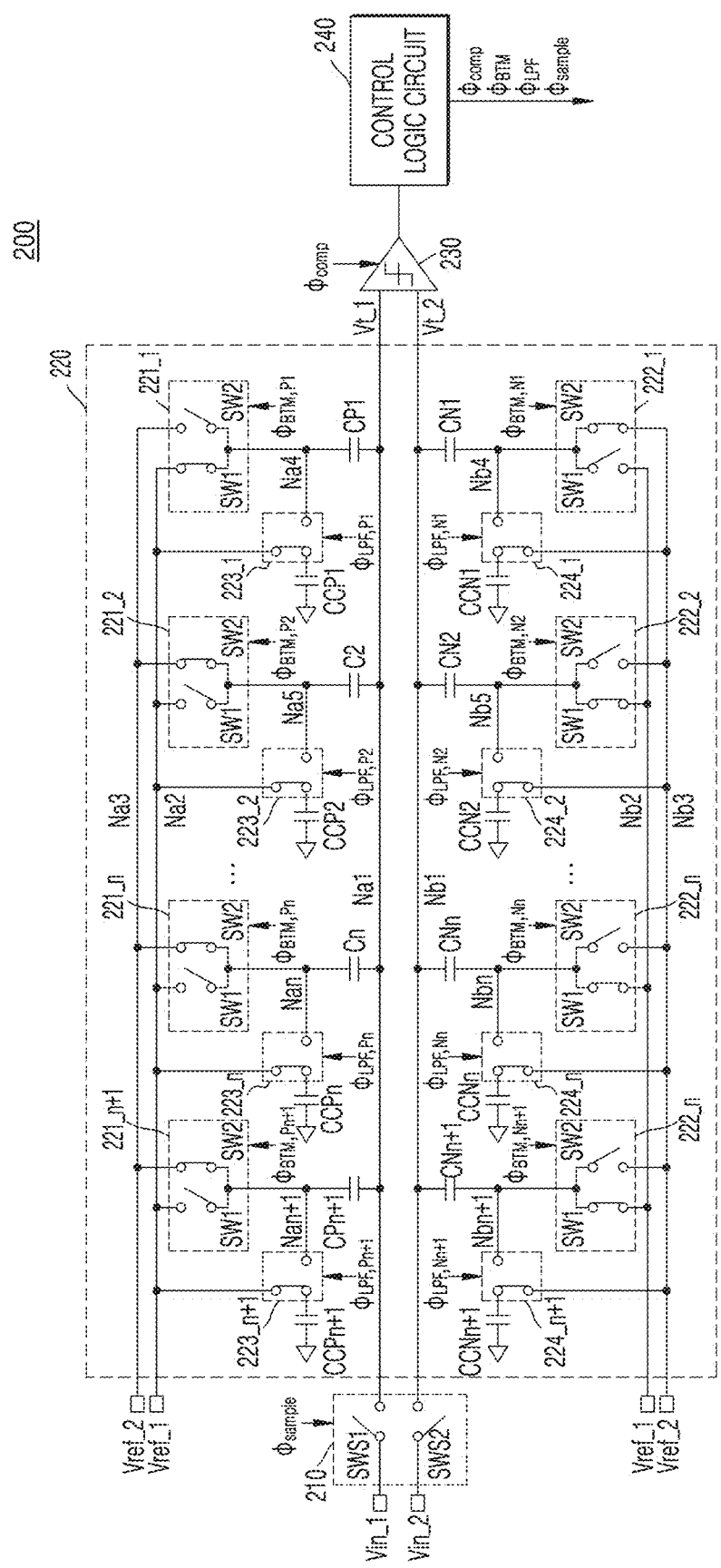

Referring to FIG. 3C, the circuit diagram shown in FIG. 3C shows an example of a third operation period of the analog-to-digital converter 200 subsequent to the second operation period.

After the first comparison result signal Vcomp_1 for determining the most significant bit of the digital signal Dout is generated, the control logic circuit 240 may provide the first positive pre-charge switch control signal ΦLPF,P1 having the first logic level to the first positive pre-charge switch 223_1. Also, the control logic circuit 240 may provide the first negative pre-charge switch control signal ΦLPF,N1 having the first logic level to the first negative pre-charge switch 224_1. The first positive pre-charge switch 223_1 may electrically connect the first pre-charge capacitor CCP1 from the first positive filtering node Na4 to the first delivery node Na2. The first negative pre-charge switch 224_1 may electrically connect the first pre-charge capacitor CCN1 from the first negative filtering node Nb4 to the second delivery node Nb2. However, inventive concepts are not limited thereto, and, to maximize or increase or improve a noise filtering effect, the control logic circuit 240 may control each positive pre-charge switch to connect each pre-charge capacitor corresponding to a comparison result to each filtering node.

The control logic circuit 240 may provide a comparing operation control signal Φcomp having the second logic level to the comparing circuit 230.

Figure 3D:
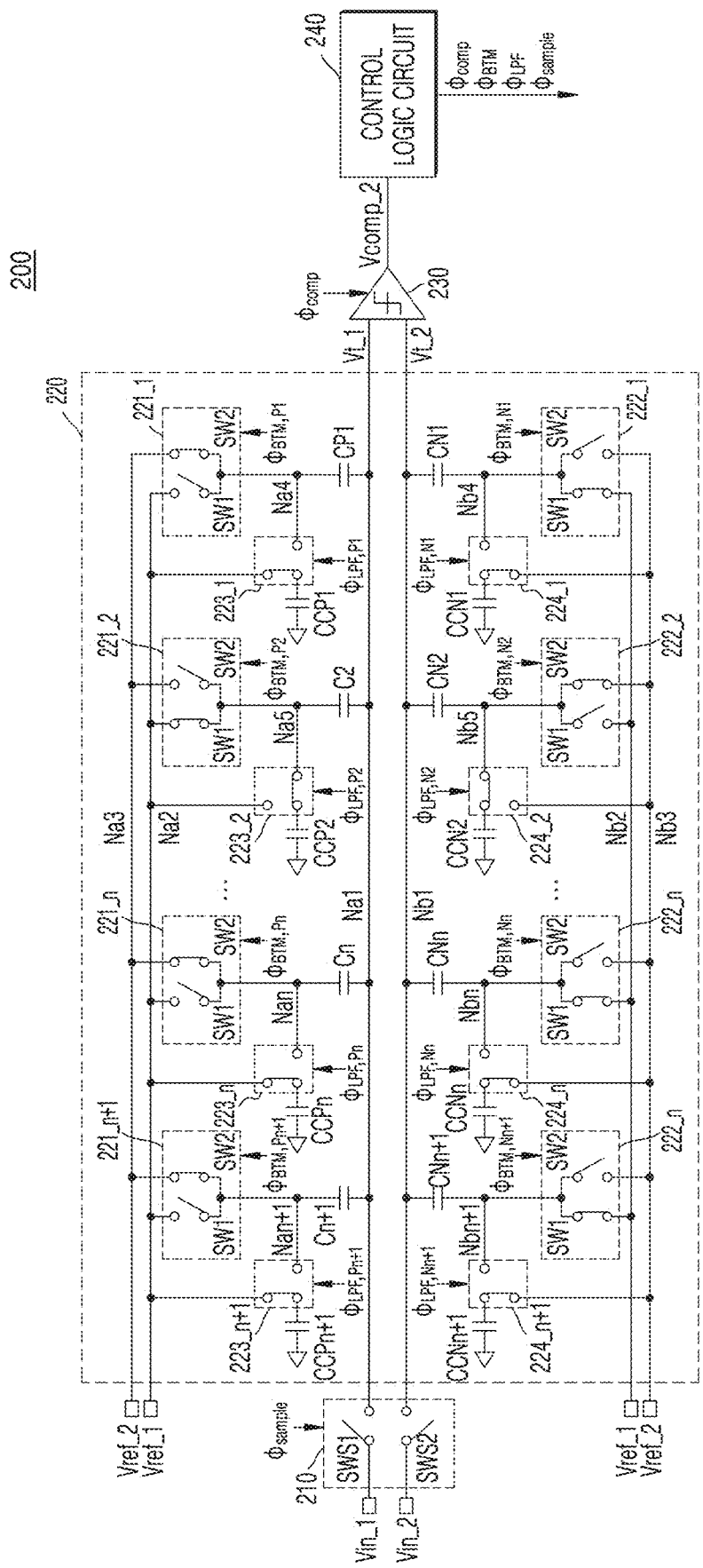

Referring to FIG. 3D, the circuit diagram shown in FIG. 3D shows an example of a fourth operation period of the analog-to-digital converter 200 subsequent to the third operation period. During the fourth operation period, the analog-to-digital converter 200 may determine the most significant bit of the digital signal Dout and perform a comparison operation for determining a less significant bit adjacent to the most significant bit of the digital signal Dout.

The control logic circuit 240 may set respective logic levels of the first positive reference voltage switch control signal ΦBTM,P1 and the first negative reference voltage switch control signal ΦBTM,N1 according to a result value of the first comparison result signal Vcomp_1. In this case, the first positive reference voltage switch control signal ΦBTM,P1 and the first negative reference voltage switch control signal ΦBTM,N1 may have different logic levels. For example, referring to FIG. 3D, the control logic circuit 240 may generate the first positive reference voltage switch control signal ΦBTM,P1 having the second logic level and the first negative reference voltage switch control signal ΦBTM,N1 having the first logic level in response to the first comparison result signal Vcomp_1 having the first result value (e.g., 1). In this case, the first positive reference voltage switch 221_1 may electrically connect the first transmission node Na3 to the first positive filtering node Na4 in response to the first positive reference voltage switch control signal ΦBTM,P1 having the second logic level. Also, the first negative reference voltage switch 222_1 may electrically connect the second delivery node Nb2 to the first negative filtering node Nb4 in response to the first negative reference voltage switch control signal ΦBTM,N1 having the first logic level. However, inventive concepts are not limited thereto. In some other examples, unlike as shown in FIG. 3D, the control logic circuit 240 may generate the first positive reference voltage switch control signal ΦBTM,P1 having the first logic level and the first negative reference voltage switch control signal ΦBTM,N1 having the second logic level in response to the first comparison result signal Vcomp_1 having the second result value (e.g., 0).

The control logic circuit 240 may provide a second positive reference voltage switch control signal ΦBTM,P2 having the first logic level to a second positive reference voltage switch 221_2 and may provide a second negative reference voltage switch control signal ΦBTM,N2 to a second negative reference voltage switch 222_2. In this case, the first delivery node Na2 may be electrically connected to the second positive filtering node Na5, and the second transmission node Nb3 may be electrically connected to the second negative filtering node Nb5.

The control logic circuit 240 may provide a second positive pre-charge switch control signal ΦLPF,P2 having the second logic level to a second positive pre-charge switch 223_2. In this case, the second positive filtering node Na5 may be electrically connected to a second pre-charge capacitor CCP2. Also, the control logic circuit 240 may provide a second negative pre-charge switch control signal ΦLPF,N2 having the second logic level to a second negative pre-charge switch 224_2. In this case, the second negative filtering node Nb5 may be electrically connected to a second pre-charge capacitor CCN2.

The control logic circuit 240 may provide a comparing operation control signal Φcomp having pulses of the first logic level to the comparing circuit 230. In this case, while the comparing operation control signal Φcomp maintains the first logic level, the comparing circuit 230 may provide a second comparison result signal Vcomp_2 indicating a result of a comparison between the first target voltage Vt_1 and the second target voltage Vt_2 to the control logic circuit 240.

Figure 3E:
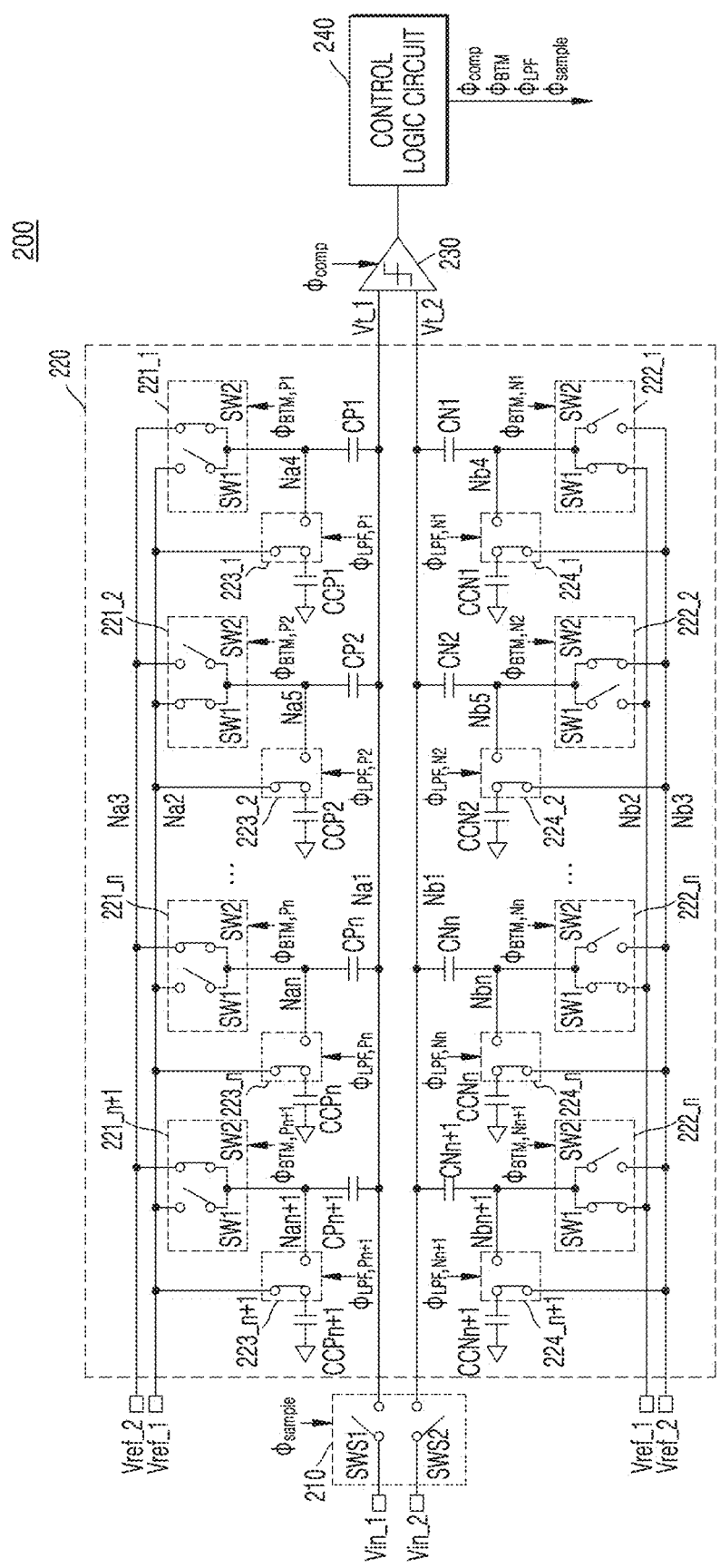

Referring to FIG. 3E, the circuit diagram shown in FIG. 3E shows an example of a fifth operation period of the analog-to-digital converter 200 subsequent to the fourth operation period.

After the second comparison result signal Vcomp_2 for determining a less significant bit adjacent to the most significant bit of the digital signal Dout is generated, the control logic circuit 240 may provide the second positive pre-charge switch control signal ΦLPF,P2 having the first logic level to the second positive pre-charge switch 223_2. Also, the control logic circuit 240 may provide the second negative pre-charge switch control signal ΦLPF,N2 having the first logic level to the second negative pre-charge switch 224_2. The second pre-charge capacitor CCP2 may be electrically connected to the first delivery node Na2, and the second pre-charge capacitor CCN2 may be electrically connected to the second transmission node Nb3.

The control logic circuit 240 may provide a comparing operation control signal Φcomp having the second logic level to the comparing circuit 230.

After the fifth operation period, the control logic circuit 240 may generate the second positive reference voltage switch control signal ΦBTM,P2 and the second negative reference voltage switch control signal ΦBTM,N2 having logic levels different from each other according to a result value (e.g., 1 or 0) of the second comparison result signal Vcomp_2.

When a less significant bit adjacent to the most significant bit of the digital signal Dout is determined, bits of the digital signal Dout from a less significant bit adjacent to a determined bit to the least significant bit may be sequentially determined. For example, the remaining capacitors CPn, CPn+1, CNn, and CNn+1, the remaining pre-charge capacitors CCPn, CCPn+1, CCNn, and CCNn+1, the remaining positive reference voltage switches 221_n and 221_n+1, the remaining positive pre-charge switches 223_n and 223_n+1, the remaining negative reference voltage switches 222_n and 222_n+1, and the remaining negative pre-charge switches 224_n and 224_n+1 may perform operations similar to those of FIGS. 3B to 3E.

Figure 4:
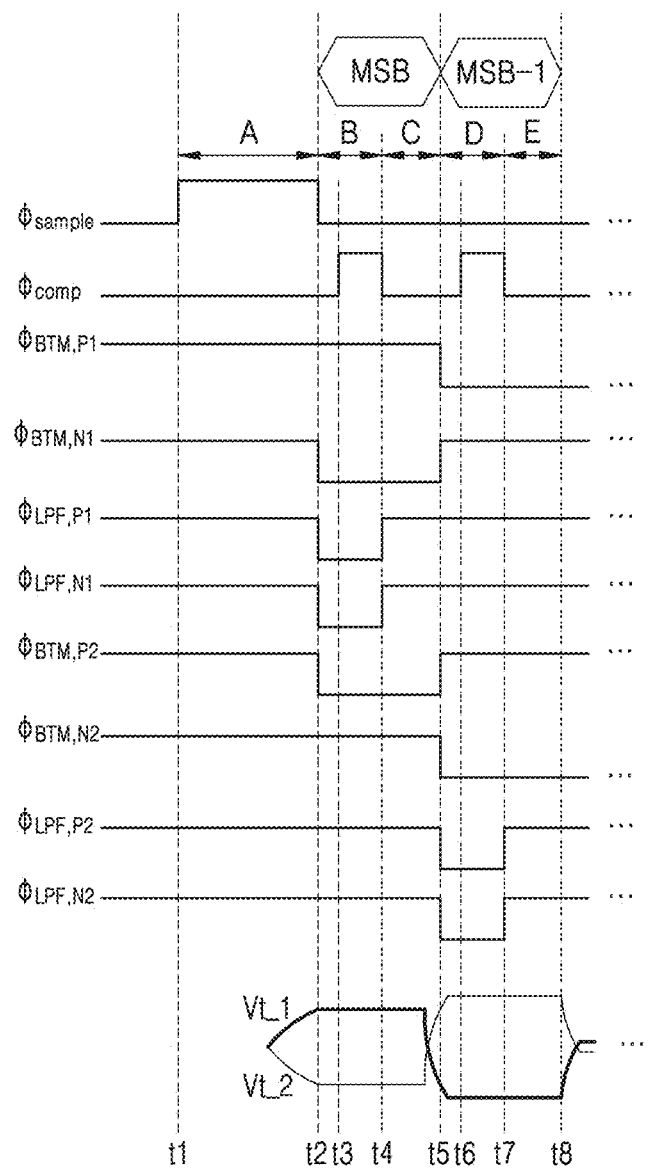
FIG. 4 is a diagram for describing timings of control signals in the operating method described with reference to FIGS. 3A to 3E.

FIG. 4 is a diagram for describing timings of control signals in the operating method described with reference to FIGS. 3A to 3E. In the description of FIG. 4, it will be assumed that the first logic level is a logic high level and the second logic level is a logic low level.

Referring to FIG. 4, operation periods of the analog-to-digital converter 200 may include a first operation period A, a second operation period B, a third operation period C, a fourth operation period D, and a first operation period E. The first operation period A may be a period in which the analog-to-digital converter 200 performs a sampling operation as shown in FIG. 3A. The second operation period B may be a period in which the analog-to-digital converter 200 performs a comparison operation as shown in FIG. 3B. The third operation period C may be a period in which the analog-to-digital converter 200 performs a pre-charging operation as shown in FIG. 3C. The fourth operation period D may be a period in which the analog-to-digital converter 200 performs a determination operation and a comparison operation as shown in FIG. 3D. The fifth operation period E may be a period in which the analog-to-digital converter 200 performs a determination operation and a pre-charging operation as shown in FIG. 3E.

During the first operation period A, the sample/hold control signal Φsample, the first to n+1 positive reference voltage switch control signals ΦBTM,P1, ΦBTM,P2, ΦBTM,Pn, and ΦBTM,Pn+1, the first to n+1-th negative reference voltage switch control signals ΦBTM,N1, ΦBTM,N2, ΦBTM,Nn, and ΦBTM,Nn+1, the first to n+1-th positive pre-charge switch control signals ΦLPF,P1, ΦLPF,P2, ΦLPF,Pn, and ΦLPF,Pn+1, and the first to n+1-th negative pre-charge switch control signals ΦLPF,N1, ΦLPF,N2, ΦLPF,Nn, and ΦLPF,Nn+1 may have the first logic level. The first target voltage Vt_1 may gradually increase, and the second target voltage Vt_2 may gradually decrease.

The sample/hold control signal Φsample may have the second logic level after the first operation period A.

The comparing operation control signal Φcomp may be a pulse wave having a certain period when synchronous method is performed after the first operation period A and may be a pulse wave having no certain period when asynchronous method is performed. The logic level of the pulse wave may be the first logic level. The period of a pulse wave may be time corresponding to a difference between a second time point t2 and a fifth time point t5. For example, referring to FIG. 4, the comparing operation control signal Φcomp may rise from the second logic level to the first logic level at a third time point t3 and may drop from the first logic level to the second logic level at a fourth time point t4. Thereafter, the comparing operation control signal Φcomp may rise from the second logic level to the first logic level at a sixth time point t6 and may drop from the first logic level to the second logic level at a seventh time point t7.

The first positive reference voltage switch control signal ΦBTM,P1 may have the first logic level during the second operation period B and the third operation period C. The first negative reference voltage switch control signal ΦBTM,N1 may have the second logic level during the second operation period B and the third operation period C. The logic levels of the first positive reference voltage switch control signal ΦBTM,P1 and the first negative reference voltage switch control signal ΦBTM,N1 may each be set according to a result value of the first comparison result signal Vcomp_1 described above with reference to FIG. 3B after the third operation period C. Referring to FIGS. 3D and 4, when the first target voltage Vt_1 is higher than the second target voltage Vt_2, the first comparison result signal Vcomp_1 may be the first result value. In this case, the first positive reference voltage switch control signal ΦBTM,P1 may have the second logic level after the third operation period C, and the first negative reference voltage switch control signal ΦBTM,N1 may have the first logic level after the third operation period C. However, inventive concepts are not limited thereto. When the first comparison result signal Vcomp_1 has the second result value, the first positive reference voltage switch control signal ΦBTM,P1 may have the first logic level and the first negative reference voltage switch control signal ΦBTM,N1 may have the second logic level.

From the third operation period C, the first target voltage Vt_1 may gradually decrease, and the second target voltage Vt_2 may gradually increase.

The first positive pre-charge switch control signal ΦLPF, P1 and the first negative pre-charge switch control signal ΦLPF,N1 may have the second logic level during the second operation period B and may have the first logic level after the second operation period B.

The second positive reference voltage switch control signal ΦBTM,P2 may have the second logic level during the second operation period B and the third operation period C and may have the first logic level during the fourth operation period D and the fifth operation period E. The second negative reference voltage switch control signal ΦBTM,N2 may have the first logic level during the second operation period B and the third operation period C and may have the second logic level during the fourth operation period D and the fifth operation period E. The logic levels of the second positive reference voltage switch control signal ΦBTM,P2 and the second negative reference voltage switch control signal ΦBTM,N2 may each be set according to a result value of the second comparison result signal Vcomp_2 after the fifth operation period E. For example, referring to FIGS. 3D and 4, when the first target voltage Vt_1 is lower than the second target voltage Vt_2, the first comparison result signal Vcomp_1 may be the second result value. After the fifth operation period E, the second positive reference voltage switch control signal ΦBTM,P2 may have the first logic level and the second negative reference voltage switch control signal ΦBTM,N2 may have the second logic level.

The second positive pre-charge switch control signal ΦLPF,P2 and the second negative pre-charge switch control signal ΦLPF,N2 may have the first logic level during the second operation period B and the third operation period C, may have the second logic level during the fourth operation period D, and may have the first logic level after the fourth operation period D.

Figure 5A:
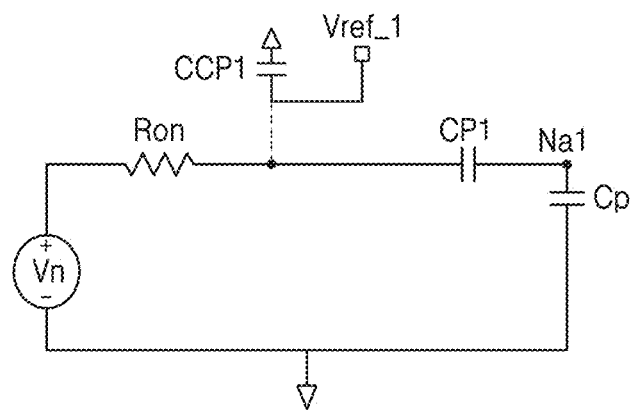
FIGS. 5A and 5B are equivalent circuit diagrams modeling noise occurring in a sub digital-to-analog converter shown in FIG. 2.
Figure 5B:
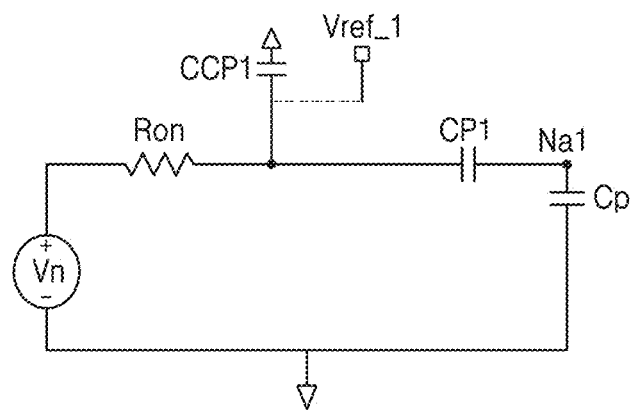

FIGS. 5A and 5B are equivalent circuit diagrams modeling noise occurring in a sub digital-to-analog converter shown in FIG. 2. In detail, FIG. 5A is a circuit diagram modeling a case where the first pre-charge capacitor CCP1 included in the first sub digital-to-analog converter is electrically connected to the first reference voltage Vref_1, and FIG. 5B is a circuit diagram modeling a case where the first pre-charge capacitor CCP1 included in the first sub digital-to-analog converter is electrically connected to the first positive filtering node Na4.

Referring to FIGS. 2 and 5A, every time the first positive reference voltage switch 221_1 is electrically connected to the first delivery node Na2 or the first transmission node Na3, thermal noise due to switch connection may occur. The thermal noise due to switch connection may be modeled as a noise voltage Vn and a noise ON resistor Ron as shown in FIGS. 5A and 5B. When the thermal noise due to switch connection is applied to the comparing circuit 230, an error may occur in a result value of the comparison result signal Vcomp. To block such thermal noise, a low pass filter structure is needed or used, for example.

Meanwhile, there may be a parasitic capacitor $C_P$ at the first comparing node Na1. The capacitance of the parasitic capacitor $C_P$ may be significantly less than the capacitance of the first capacitor CP1. A RC filter circuit is implemented based on the characteristic of the parasitic capacitor $C_P$, wherein the RC filter circuit may exhibit low filter pass characteristics. However, because the first capacitor CP1 is connected in series with the parasitic capacitor $C_P$, an equivalent capacitance becomes less than the capacitance of the parasitic capacitor $C_P$, which is already relatively or very small, thermal noise may not be sufficiently blocked due to factors like increase of a cut off frequency.

Referring to FIGS. 2 and 5B, when the first positive pre-charge switch 223_1 electrically connects the first positive filtering node Na4 to the first pre-charge capacitor CCP1 for a comparison operation, the first pre-charge capacitor CCP1 may be connected to the first capacitor CP1 in parallel. In this case, the equivalent capacitance becomes greater than the capacitance of the first pre-charge capacitor CCP1, and thus, the cut off frequency may become sufficiently small to sufficiently block thermal noise.

Meanwhile, because the first pre-charge capacitor CCP1 is pre-charged by the first reference voltage Vref_1 before the comparison operation is performed as shown in FIG. 5A, even when the first pre-charge capacitor CCP1 is connected to the first positive filtering node Na4 as shown in FIG. 5B, a fixing time needed or used for the first target voltage Vt_1 of the first comparing node Na1 to reach a logic level for comparison is not delayed.

According to some example embodiments described above, in a case of comparing sizes of analog signals, as a pre-charge capacitor that is charged in advance is connected to the filtering nodes, thermal noise generated by a switch may be reduced, comparison efficiency may be improved, and an operation speed may be improved. Also, according to some example embodiments described above, by using a pre-charge capacitor that is charged in advance, power consumption for charging and discharging may be reduced.

With reference to FIGS. 5A and 5B, a noise filtering operation has been described based on the first capacitor CP1, the first positive reference voltage switch 221_1, the first positive pre-charge switch 223_1, and the first pre-charge capacitor CCP1 included in the first sub digital-to-analog converter. However, inventive concepts are not limited thereto. The above descriptions may also be identically applied to second to n+1-th capacitors CP2, CPn, and CPn+1, the second to n+1-th positive reference voltage switches 221_2, 221_n, and 221_n+1, the second to n+1-th positive pre-charge switches 223_2, 223_n, and 223_n+1, and second to n+1-th pre-charge capacitors CCP2, CCPn, and CCPn+1 and may be identically applied to the second sub digital-to-analog converter.

Figure 6A:
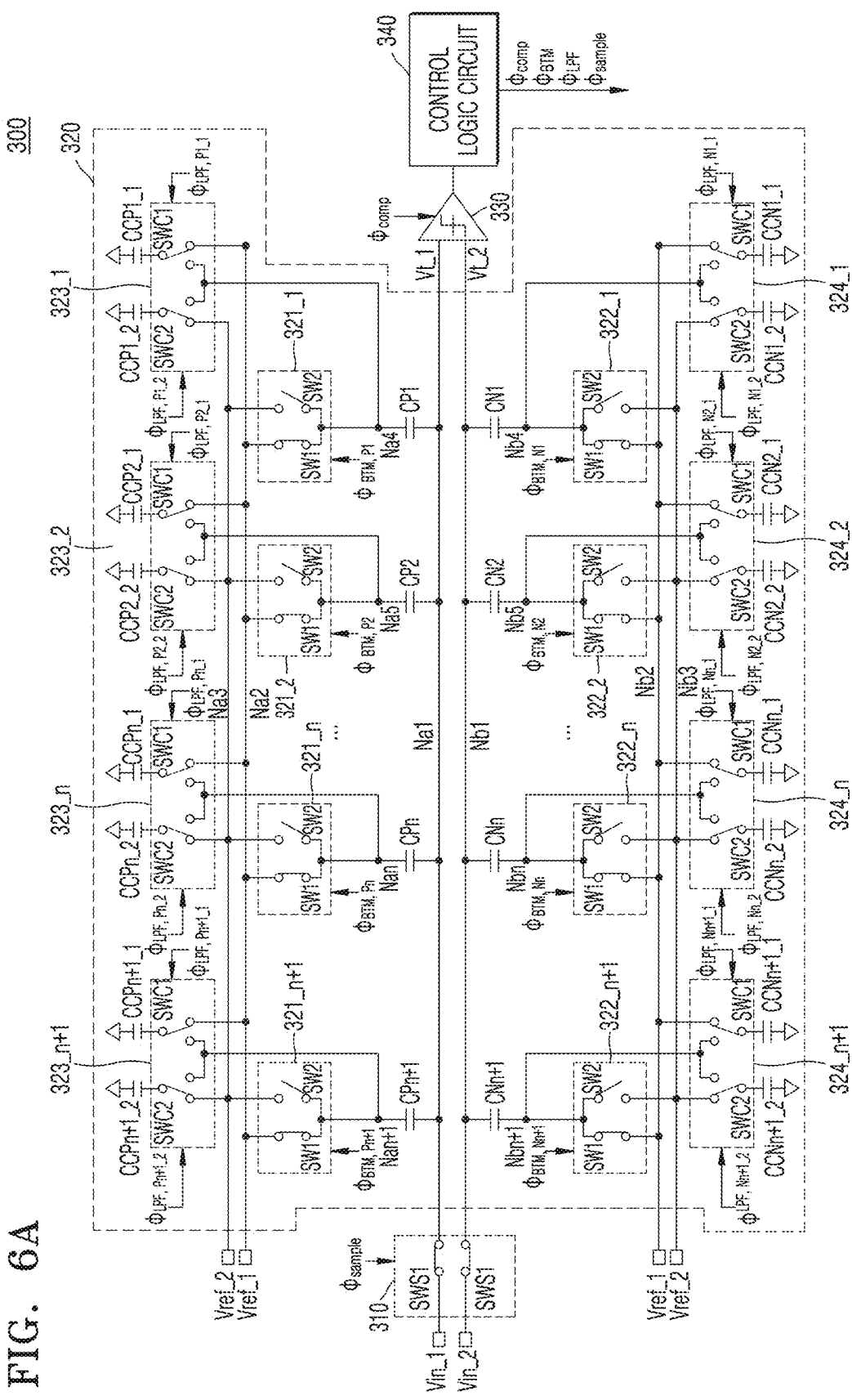
FIGS. 6A to 6C are diagrams for describing an operating method of an analog-to-digital converter according to some example embodiments.
Figure 6B:
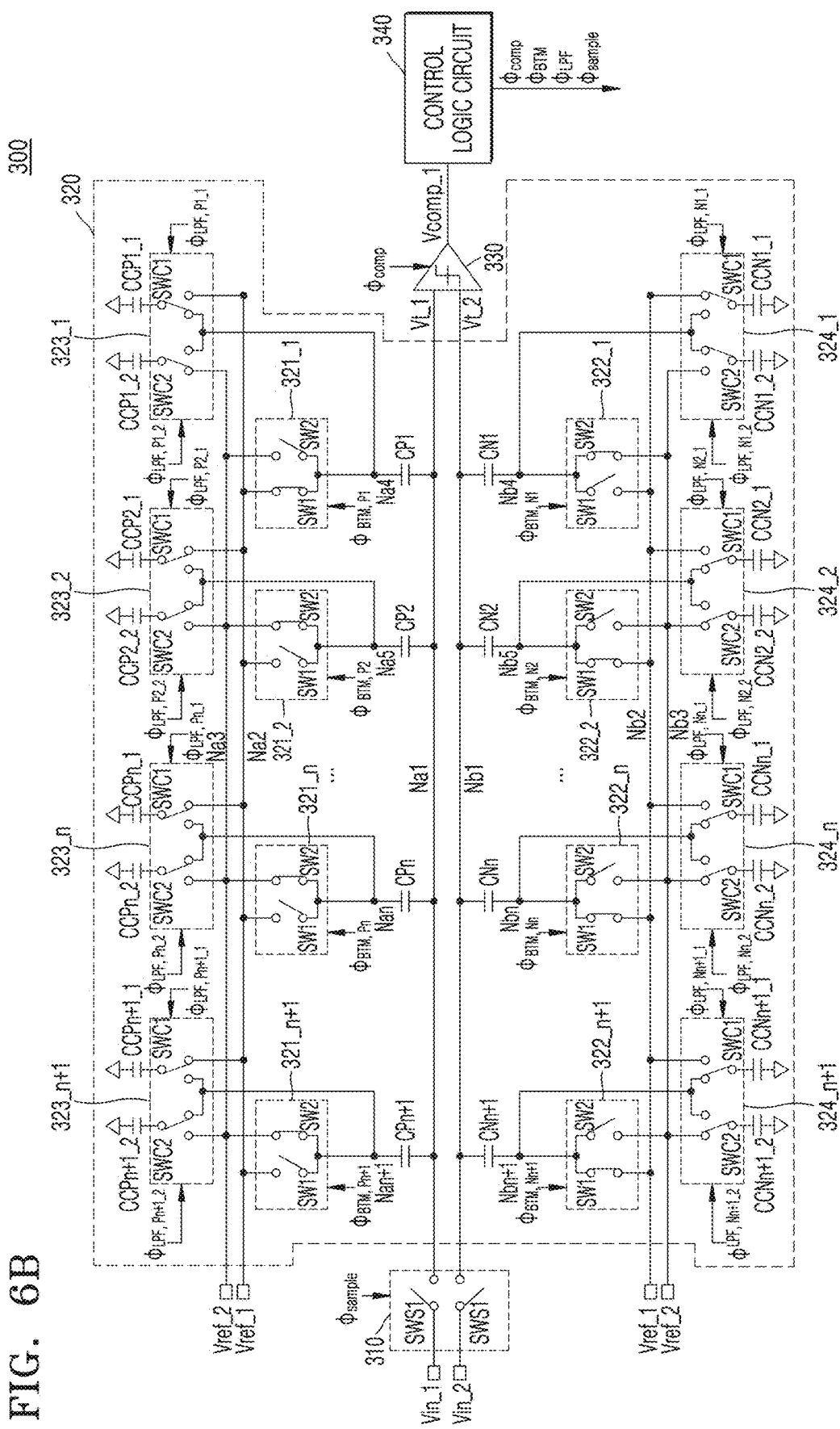
Figure 6C:
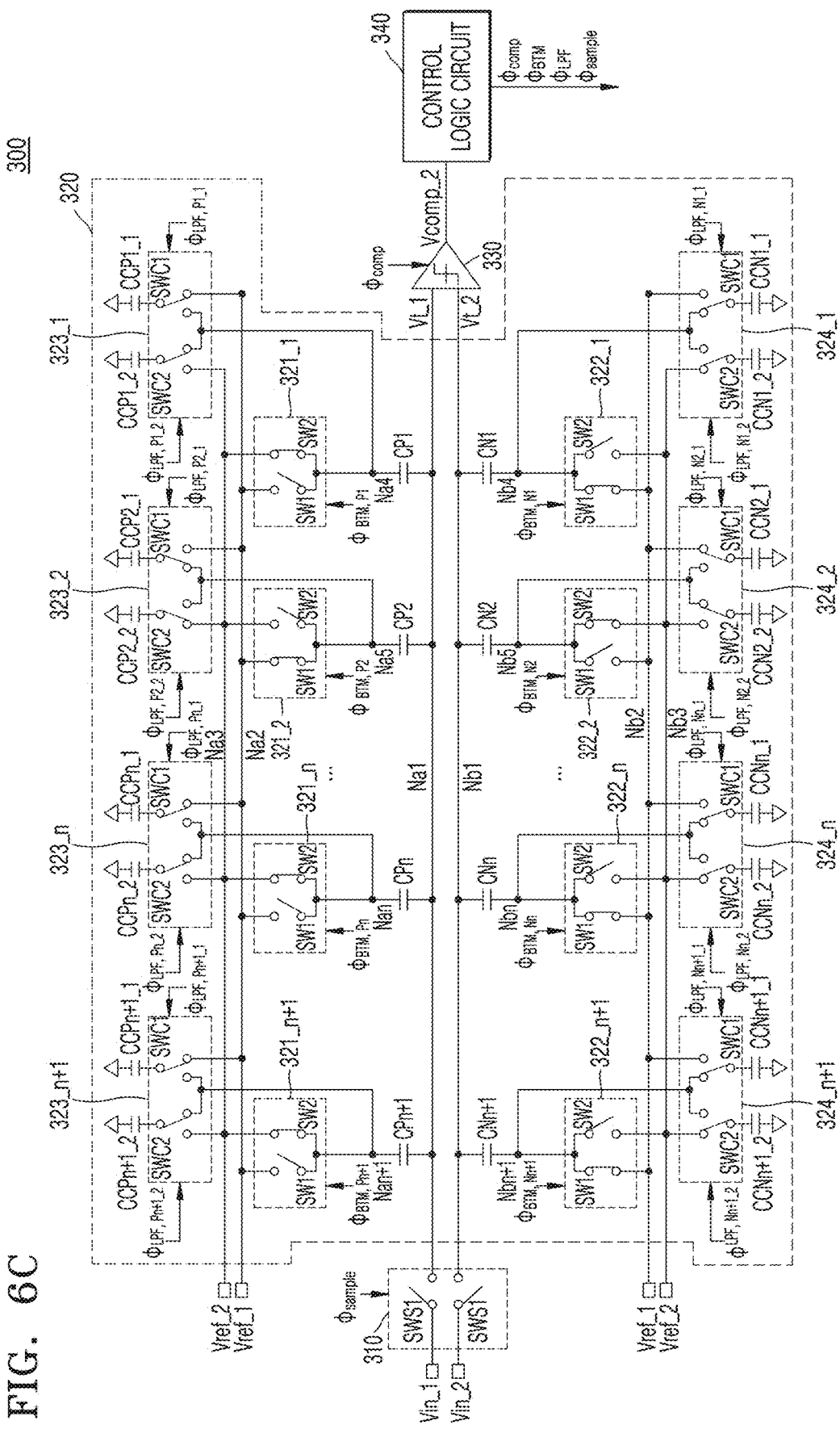

FIGS. 6A to 6C are diagrams for describing an operating method of an analog-to-digital converter according to some example embodiments. In the descriptions of circuit diagrams shown in FIGS. 6A to 6C, descriptions identical to those already given above are omitted, and descriptions below will focus on changes in connection relationships among circuits, devices, or nodes.

Referring to FIGS. 6A to 6C, similarly as described above with reference to FIG. 2, an analog-to-digital converter 300 may include a sample/hold circuit 310, first to n+1-th positive reference voltage switches 321_1, 321_2, 321_n, and 321_n+1, first to n+1-th negative reference voltage switches 322_1, 322_2, 322_n, and 322_n+1, first to n+1-th positive pre-charge switches 323_1, 323_2, 323_n, and 323_n+1, first to n+1-th negative pre-charge switches 324_1, 324_2, 324_n, and 324_n+1, first to n+1-th positive pre-charge capacitors CCP1_1, CCP2_1, CCPn_1, CCPn+1_1, CCN1_1, CCN2_1, CCNn_1, and CCNn+1_1, first to n+1-th negative pre-charge capacitors CCP1_2, CCP2_2, CCPn_2, CCPn+1_2, CCN1_2, CCN2_2, CCNn_2, and CCNn+1_2, a comparing circuit 330, and a control logic circuit 340. The sample/hold circuit 310, the first to n+1-th positive reference voltage switches 321_1, 321_2, 321_n, and 321_n+1, the first to n+1-th negative reference voltage switches 322_1, 322_2, 322_n, and 322_n+1, and the comparing circuit 330 may operate as described above with reference to FIGS. 3B to 3E. Descriptions thereof are omitted below.

The first to n+1-th positive pre-charge switches 323_1, 323_2, 323_n, and 323_n+1 may each include a first charge switch SWC1 and a second charge switch SWC2. Operations of the first charge switch SWC1 and the second charge switch SWC2 are described below with reference to FIGS. 6A to 6C.

The control logic circuit 340 may generate first sub positive pre-charge control signals ΦLPF,P1_1, ΦLPF,P2_1, ΦLPF,Pn_1, and ΦLPF,Pn+1_1, second sub positive pre-charge control signals ΦLPF,P1_2, ΦLPF,P2_2, ΦLPF, Pn_2, and ΦLPF,Pn+1_2, first sub negative pre-charge control signals ΦLPF,N1_1, ΦLPF,N2_1, ΦLPF,Nn_1, and ΦLPF,Nn+1_1, and second sub negative pre-charge control signals ΦLPF,N1_2, ΦLPF,N2_2, ΦLPF,Nn_2, and ΦLPF, Nn+1_2.

The first sub positive pre-charge control signals ΦLPF, P1_1, ΦLPF,P2_1, ΦLPF,Pn_1, and ΦLPF,Pn+1_1 may be signals for controlling the operation of first charge switches SWC1 included in the first to n+1-th positive pre-charge switches 323_1, 323_2, 323_n, and 323_n+1. For example, when the logic level of a first sub positive pre-charge control signal ΦLPF,P1_1 applied to the first positive pre-charge switch 323_1 is the first logic level, the first charge switch SWC1 included in the first positive pre-charge switch 323_1 may electrically connect a first positive pre-charge capacitor CCP1_1 to the first delivery node Na2. In another example, when the logic level of the first sub positive pre-charge control signal ΦLPF,P1_1 applied to the first positive pre-charge switch 323_1 is the second logic level, the first charge switch SWC1 included in the first positive pre-charge switch 323_1 may electrically connect the first positive pre-charge capacitor CCP1_1 to the first positive filtering node Na4.

The second sub positive pre-charge control signals ΦLPF, P1_2, ΦLPF,P2_2, ΦLPF,Pn_2, and ΦLPF,Pn+1_2 may be signals for controlling the operation of second charge switches SWC2 included in the first to n+1-th positive pre-charge switches 323_1, 323_2, 323_n, and 323_n+1. For example, when the logic level of second sub positive pre-charge control signals ΦLPF,P1_2 applied to the first positive pre-charge switch 323_1 is the first logic level, the second charge switch SWC2 included in the first positive pre-charge switch 323_1 may electrically connect a first negative pre-charge capacitor CCP1_2 to the first transmission node Na3. In another example, when the logic level of the second sub positive pre-charge control signals ΦLPF, P1_2 applied to the first positive pre-charge switch 323_1 is the second logic level, the second charge switch SWC2 included in the first positive pre-charge switch 323_1 may electrically connect the first negative pre-charge capacitor CCP1_2 to the first positive filtering node Na4.

The first sub negative pre-charge control signals ΦLPF, N1_1, ΦLPF,N2_1, ΦLPF,Nn_1, and ΦLPF,Nn+1_1 may be signals for controlling the operation of first charge switches SWC1 included in the first to n+1-th negative pre-charge switches 324_1, 324_2, 324_n, and 324_n+1. Descriptions thereof are similar to the descriptions of the first sub positive pre-charge control signals ΦLPF,P1_1, ΦLPF,P2_1, ΦLPF, Pn_1, and ΦLPF,Pn+1_1 and will be omitted below.

The second sub negative pre-charge control signals ΦLPF,N1_2, ΦLPF,N2_2, ΦLPF,Nn_2, and ΦLPF,Nn+1_2 may be signals for controlling the operation of second charge switches SWC2 included in the first to n+1-th negative pre-charge switches 324_1, 324_2, 324_n, and 324_n+1. Descriptions thereof are similar to the descriptions of the second sub positive pre-charge control signals ΦLPF,P1_2, ΦLPF,P2_2, ΦLPF,Pn_2, and ΦLPF,Pn+1_2 and will be omitted below.

Referring to FIG. 6A, first charge switches SWC1 included in the first to n+1-th positive pre-charge switches 323_1, 323_2, 323_n, and 323_n+1 may electrically connect first to n+1-th positive pre-charge capacitors CCP1_1, CCP2_1, CCPn_1, to CCPn+1_1 to the first delivery node Na2. Second charge switches SWC2 included in the first to n+1-th positive pre-charge switches 323_1, 323_2, 323_n, and 323_n+1 may electrically connect first to n+1-th negative pre-charge capacitors CCP1_2, CCP2_2, CCPn_2, and CCPn+1_2 to the first transmission node Na3.

First charge switches SWC1 included in the first to n+1-th negative pre-charge switches 324_1, 324_2, 324_n, and 324_n+1 may electrically connect first to n+1-th positive pre-charge capacitors CCN1_1, CCN2_1, CCNn_1, and CCNn+1_1 to the second delivery node Nb2. Second charge switches SWC2 included in the first to n+1-th negative pre-charge switches 324_1, 324_2, 324_n, and 324_n+1 may electrically connect first to n+1-th negative pre-charge capacitors CCN1_2, CCN2_2, CCNn_2, and CCNn+1_2 to the second transmission node Nb3.

Referring to FIG. 6B, the first charge switch SWC1 included in the first positive pre-charge switch 323_1 may electrically connect the first positive pre-charge capacitor CCP1_1 to the first positive filtering node Na4. Second charge switches SWC2 included in second to n+1-th positive pre-charge switches 323_2, 323_n, and 323_n+1 may electrically connect second to n+1-th negative pre-charge capacitors CCP2_2, CCPn_2, and CCPn+1_2 to the second to n+1-th positive filtering nodes Na5, Nan, and Nan+1, respectively.

A second charge switch SWC2 included in a first negative pre-charge switch 324_1 may electrically connect a first negative pre-charge capacitor CCN1_2 to the first negative filtering node Nb4. First charge switches SWC1 included in second to n+1-th negative pre-charge switches 324_2, 324_n, and 324_n+1 may electrically connect second to n+1-th negative pre-charge capacitors CCN2_2, CCNn_2, and CCNn+1_2 to the second to n+1-th negative filtering nodes Nb5, Nbn, and Nbn+1, respectively.

The comparing circuit 330 may provide the first comparison result signal Vcomp_1 to the control logic circuit 340.

Referring to FIG. 6C, it will be assumed that the first comparison result signal Vcomp_1 is a signal having a first result value. In this case, a first positive reference voltage switch 321_1 may electrically connect the first transmission node Na3 to the first positive filtering node Na4. A first negative reference voltage switch 322_1 may electrically connect the second delivery node Nb2 to the first negative filtering node Nb4. A first charge switch SWC1 included in the first positive pre-charge switch 323_1 may electrically connect the first positive pre-charge capacitor CCP1_1 to the first delivery node Na2. A second charge switch SWC2 included in the first positive pre-charge switch 323_1 may electrically connect the first negative pre-charge capacitor CCP1_2 to the first positive filtering node Na4. A first charge switch SWC1 included in the first negative pre-charge switch 324_1 may electrically connect a first positive pre-charge capacitor CCN1_1 to the first negative filtering node Nb4. A second charge switch SWC2 included in the first negative pre-charge switch 324_1 may electrically connect the first negative pre-charge capacitor CCN1_2 to the second transmission node Nb3.

A second positive reference voltage switch 321_2 may electrically connect the first delivery node Na2 and the second positive filtering node Na5. A second negative reference voltage switch 323_2 may electrically connect the second transmission node Nb3 and the second negative filtering node Nb5. A second positive pre-charge switch 323_2 may electrically connect a second positive pre-charge capacitor CCP2_1 to the second positive filtering node Na5 and electrically connect a second negative pre-charge capacitor CCP2_2 to the first transmission node Na3. A second negative pre-charge switch 324_2 may electrically connect a second positive pre-charge capacitor CCN2_1 to the second delivery node Nb2 and electrically connect a second negative pre-charge capacitor CCN2_2 to the second negative filtering node Nb5.

The comparing circuit 330 may provide the second comparison result signal Vcomp_2 to the control logic circuit 340.

Figure 7:
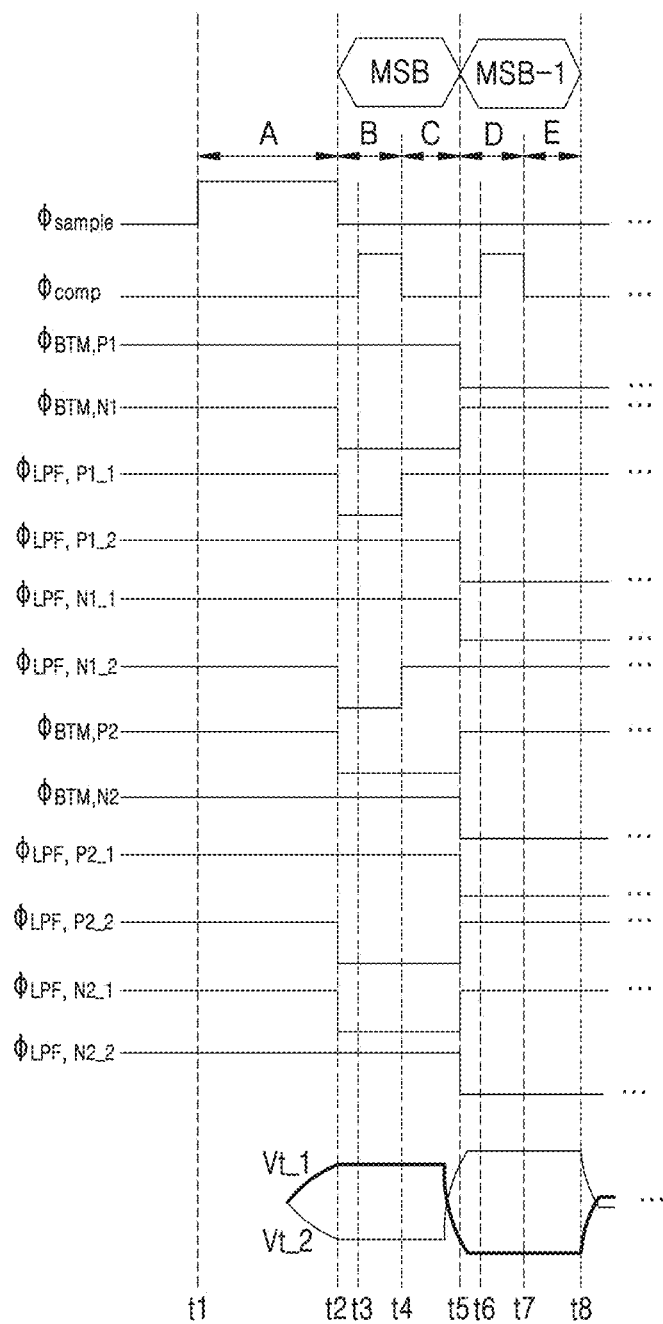
FIG. 7 is a diagram for describing timings of control signals in the operating method described with reference to FIGS. 6A to 6C.

FIG. 7 is a diagram for describing timings of control signals in the operating method described with reference to FIGS. 6A to 6C. In the description of FIG. 7, it will be assumed that the first logic level is a logic high level and the second logic level is a logic low level.

Referring to FIGS. 6A to 6C and 7, the sample/hold control signal Φsample, the first to n+1 positive reference voltage switch control signals ΦBTM,P1, ΦBTM,P2, ΦBTM,Pn, and ΦBTM,Pn+1, the first to n+1-th negative reference voltage switch control signals ΦBTM,N1, ΦBTM, N2, ΦBTM,Nn, and ΦBTM,Nn+1, and the comparing operation control signal Φcomp are identical to those described above with reference to FIG. 4.

An operating method according to control signals generated during the first operation period A may correspond to the circuit diagram shown in FIG. 6A, an operating method according to control signals generated during the second operation period B and the third operation period C may correspond to the circuit diagram shown in FIG. 6B, and an operating method according to control signals generated during the fourth operation period D and the fifth operation period E may correspond to the circuit diagram shown in FIG. 6C.

The first sub positive pre-charge control signals ΦLPF, P1_1, ΦLPF,P2_1, ΦLPF,Pn_1, and ΦLPF,Pn+1_1, the second sub positive pre-charge control signals ΦLPF,P1_2, ΦLPF,P2_2, ΦLPF,Pn_2, and ΦLPF,Pn+1_2, the first sub negative pre-charge control signals ΦLPF,N1_1, ΦLPF, N2_1, ΦLPF,Nn_1, and ΦLPF,Nn+1_1, and the second sub negative pre-charge control signals ΦLPF,N1_2, ΦLPF, N2_2, ΦLPF,Nn_2, and ΦLPF,Nn+1_2 may have the first logic level during the first operation period A.

The first sub positive pre-charge control signal ΦLPF, P1_1 applied to the first positive pre-charge switch 323_1 and a second sub negative pre-charge control signal ΦLPF, N1_2 applied to the first negative pre-charge switch 324_1 may have the second logic level during the second operation period B and may have the first logic level from the third operation period C.

A second sub positive pre-charge control signal ΦLPF, P1_2 applied to the first positive pre-charge switch 323_1 and a first negative pre-charge control signal ΦLPF,N1_1 applied to the first negative pre-charge switch 324_1 may have the first logic level during the second operation period B and the third operation period C and may have the second logic level after the third operation period C.

A first sub positive pre-charge control signal ΦLPF,P2_1 applied to the second positive pre-charge switch 323_2 and a second sub negative pre-charge control signal ΦLPF,N2_2 applied to the second negative pre-charge switch 324_2 may have the first logic level during the second operation period B and the third operation period C and may have the second logic level after the third operation period C.

A second sub positive pre-charge control signal ΦLPF, P2_2 applied to the second positive pre-charge switch 323_2 and a first negative pre-charge control signal ΦLPF,N2_1 applied to the second negative pre-charge switch 324_2 may have the second logic level during the second operation period B and the third operation period C and may have the first logic level after the third operation period C.

According to some example embodiments described above, by comparing sizes of analog signals by using a pre-charge capacitor that is charged in advance, comparison efficiency and an operation speed may be improved.

Figure 8A:
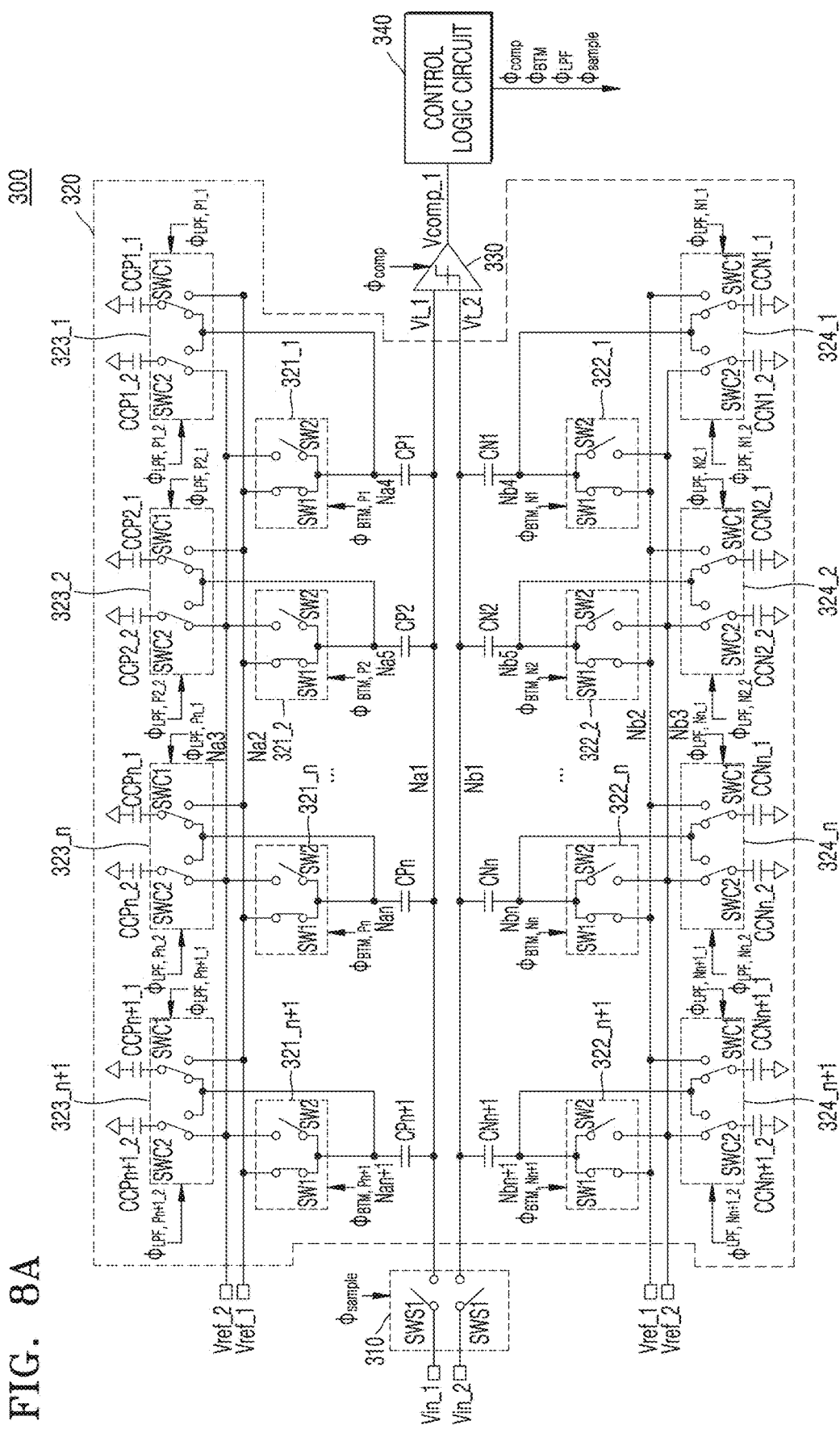
FIGS. 8A and 8B are diagrams for describing an operating method of an analog-to-digital converter according to some example embodiments.
Figure 8B:
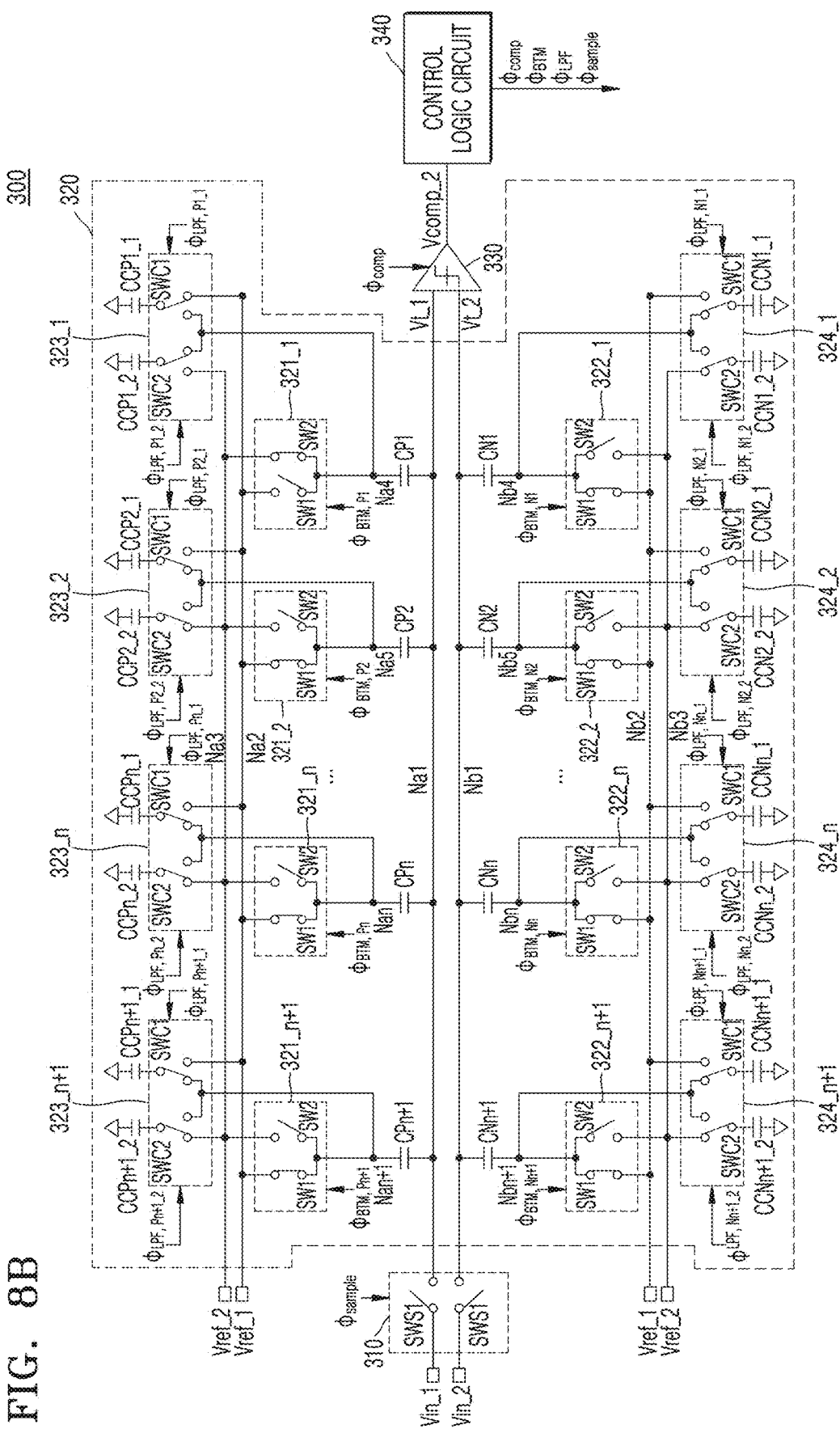

FIGS. 8A and 8B are diagrams for describing another operating method of an analog-to-digital converter according to some example embodiments. Descriptions identical to those already given above are omitted below. Also, it will be assumed that embodiments shown in FIGS. 8A and 8B correspond to circuit diagrams after the sampling operation and the pre-charging operation described above are performed.

Referring to FIG. 8A, the first to n+1-th positive reference voltage switches 321_1, 321_2, 321_n, and 321_n+1 may electrically connect the first delivery node Na2 and the first to n+1-th positive filtering nodes Na4, Na5, NAn, and Nan+1.

The first to n+1-th negative reference voltage switches 322_1, 322_2, 322_n, and 322_n+1 may electrically connect the second delivery node Nb2 and the first to n+1-th negative filtering nodes Nb4, Nb5, Nbn, and Nbn+1.

The first to n+1-th positive pre-charge switches 323_1, 323_2, 323_n, and 323_n+1 may electrically connect the first to n+1-th positive pre-charge capacitors CCP1_1, CCP2_1, CCPn_1, and CCPn+1_1 to the first to n+1-th positive filtering nodes Na4, Na5, NAn, and Nan+1 and electrically connect the first to n+1-th negative pre-charge capacitors CCP1_2, CCP2_2, CCPn_2, and CCPn+1_2 to the first transmission node Na3.

The first to n+1-th negative pre-charge switches 324_1, 324_2, 324_n, and 324_n+1 may electrically connect the first to n+1-th positive pre-charge capacitors CCN1_1, CCN2_1, CCNn_1, and CCNn+1_1 to the first to n+1-th negative filtering nodes Nb4, Nb5, Nbn, and Nbn+1 and electrically connect the first to n+1-th negative pre-charge capacitors CCN1_2, CCN2_2, CCNn_2, and CCNn+1_2 to the second transmission node Nb3.

The comparing circuit 330 may provide the first comparison result signal Vcomp_1 to the control logic circuit 340.

Referring to FIG. 8B, it will be assumed that a result value of the first comparison result signal Vcomp_1 is a first result value. In this case, a first positive reference voltage switch 321_1 may electrically connect the first transmission node Na3 to the first positive filtering node Na4. The first positive pre-charge switch 323_1 may electrically connect the first positive pre-charge capacitor CCP1_1 to the first delivery node Na2 and electrically connect the first negative pre-charge capacitor CCP1_2 to the first positive filtering node Na4.

When the result value of the first comparison result signal Vcomp_1 is a second result value, instead of the first positive reference voltage switch 321_1 and the first positive pre-charge switch 323_1, the first negative reference voltage switch 322_1 may electrically connect the second transmission node Nb3 and the first negative filtering node Nb4 and the first negative pre-charge switch 324_1 may electrically connect the first negative pre-charge capacitor CCN1_2 to the first negative filtering node Nb4.

Meanwhile, the comparing circuit 330 may provide the second comparison result signal Vcomp_2 to the control logic circuit 340.

Figure 9:
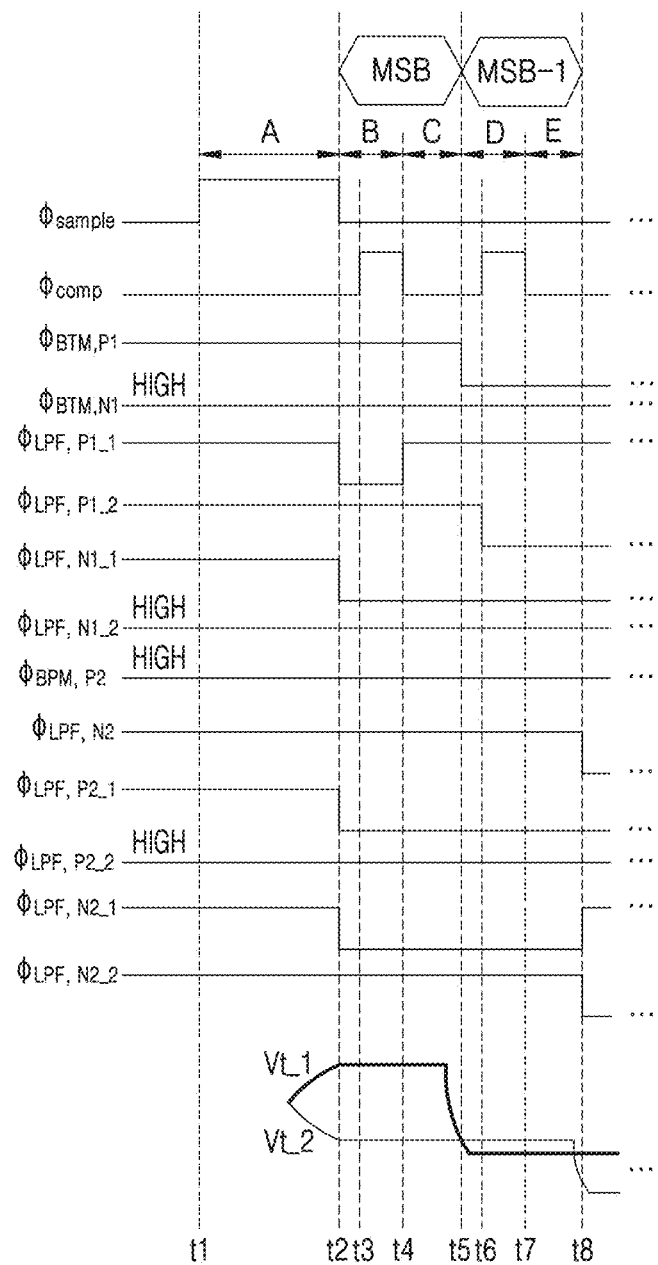
FIG. 9 is a diagram for describing timings of control signals in the operating method described with reference to FIGS. 8A and 8B.

FIG. 9 is a diagram for describing timings of control signals in the operating method described with reference to FIGS. 8A and 8B.

In FIG. 9, another operating method according to control signals generated during the second operation period B and the third operation period C may correspond to the circuit diagram shown in FIG. 8A, and another operating method according to control signals generated during the fourth operation period D and the fifth operation period E may correspond to the circuit diagram shown in FIG. 8B.

Referring to FIG. 9, the sample/hold control signal Φsample, the first positive reference voltage switch control signal ΦBTM,P1 applied to the first positive reference voltage switch 321_1, and the comparing operation control signal Φcomp are identical to those described above with reference to FIGS. 4 and 7.

In some example embodiments, the first target voltage Vt_1 may gradually increase during the first operation period A, maintain a certain (constant?) voltage level during the second operation period B and the third operation period C, gradually decrease after the third operation period C, and maintain a certain (constant?) voltage level after the fourth operation period D. The second target voltage Vt_2 may gradually decrease during the first operation period A, maintains a certain (constant?) voltage level during the second operation period B, the third operation period C, the fourth operation period D, and the fifth operation period E, gradually decrease after the fifth operation period E, and maintain a decreased voltage level. However, inventive concepts are not limited thereto.

The first negative pre-charge switch control signal ΦLPF, N1 applied to the first negative reference voltage switch 322_1, the second sub negative pre-charge control signal ΦLPF,N1_2 applied to the first negative pre-charge switch 324_1, the second positive reference voltage switch control signal ΦBTM,P2 applied to the second positive reference voltage switch 321_2, and the second sub negative pre-charge control signal ΦLPF,N2_2 applied to the second positive pre-charge switch 323_2 may have the first logic level.

The first sub positive pre-charge control signal ΦLPF, P1_1 applied to the first positive pre-charge switch 323_1 may have the second logic level during the second operation period B.

The second sub positive pre-charge control signal ΦLPF, P1_2 applied to the first positive pre-charge switch 323_1 may have the first logic level during the first operation period A, the second operation period B, and the third operation period C and may have the second logic level from the fourth operation period D.

The first negative pre-charge control signal ΦLPF,N1_1 applied to the first negative pre-charge switch 324_1 and the first sub positive pre-charge control signal ΦLPF,P2_1 applied to the second positive pre-charge switch 323_2 may have the first logic level during the first operation period A and may have the second logic level after the first operation period A.

The second negative pre-charge switch control signal ΦLPF,N2 applied to a second negative reference voltage switch 322_2 and the second sub negative pre-charge control signal ΦLPF,N2_2 applied to the second negative pre-charge switch 324_2 may have the first logic level during the first operation period A, the second operation period B, the third operation period C, the fourth operation period D, and the fifth operation period E and may have the second logic level after the fifth operation period E.

A first sub negative pre-charge control signal ΦLPF,N2_1 applied to the second negative pre-charge switch 324_2 may have the first logic level during the first operation period A, may have the second logic level during the second operation period B, the third operation period C, the fourth operation period D, and the fifth operation period E, and may have the first logic level after the fifth operation period E.

Figure 10:
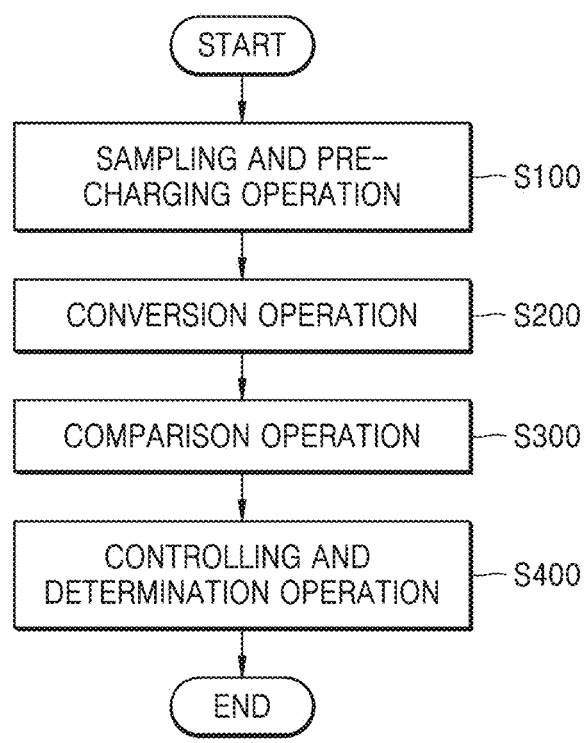
FIG. 10 is a flowchart of an operating method of an analog-to-digital converter according to some example embodiments of inventive concepts.

FIG. 10 is a flowchart of an operating method of an analog-to-digital converter according to some example embodiments of inventive concepts.

Referring to FIGS. 1 and 10, the operating method of the analog-to-digital converter 100 according to some example embodiments of inventive concepts may include a sampling and pre-charging operation (operation S100), a conversion operation (operation S200), a comparison operation (operation S300), and a controlling and determination operation (operation S400).

The sampling and pre-charging operation (operation S100) is an operation in which the first input voltage Vin_1 and the second input voltage Vin_2 are sampled, a first pre-charge capacitor (e.g., CCP1) is pre-charged based on the first reference voltage Vref_1, and a second pre-charge capacitor (e.g., CCN1) based on the second reference voltage Vref_2. Detailed description thereof is identical to the descriptions given above with reference to the circuit diagram of FIG. 3A and the first operation period A shown in FIG. 4.

The conversion operation (operation S200) is an operation in which a sampled first input voltage Vin_1 and the first reference voltage Vref_1 are applied to a first capacitor (e.g., CP1), a sampled second input voltage Vin_2 and the second reference voltage Vref_2 are applied to a second capacitor (e.g., CN1), the first pre-charge capacitor (e.g., CCP1) is connected to the first capacitor, the second pre-charge capacitor (e.g., CCN1) is connected to the second capacitor, and the first target voltage Vt_1 and the second target voltage Vt_2 are provided to a comparing circuit (e.g., 230). Detailed description thereof is identical to the descriptions given above with reference to FIG. 3B and the second operation period B shown in FIG. 4.

The comparison operation (operation S300) is an operation in which the first target voltage Vt_1 and the second target voltage Vt_2 are compared with each other and a comparison result signal (e.g., V_comp) indicating a result of the comparison is provided. Detailed description thereof is identical to the descriptions given above with reference to FIG. 3B and the second operation period B shown in FIG. 4.

The controlling and determination operation (operation S400) is an operation in which the first reference voltage Vref_1 and the second reference voltage Vref_2 are provided to the first capacitor and the second capacitor according to a comparison result output in the comparison operation (operation S300) (i.e., the comparison result signal) and a digital signal is output. Detailed description thereof is identical to the descriptions given above with reference to FIGS.

3C to 3E and the third operation period C, the fourth operation period D, and the fifth operation period E shown in FIG. 4.

In some example embodiments, in the controlling and determination operation (operation S400), in response to a comparison result that the first target voltage Vt_1 is higher than the second target voltage Vt_2, the second reference voltage Vref_2 is applied to the first capacitor and the first reference voltage Vref_1 is applied to the second capacitor. Next, in the controlling and determination operation (operation S400), a connection relationship between pre-charge capacitors and first and second capacitors is cancelled, a first pre-charge capacitor is pre-charged based on the first reference voltage Vref_1, and a second pre-charge capacitor is pre-charged based on the second reference voltage Vref_2. Detailed description thereof is identical to the descriptions given above with reference to FIG. 3D and the fourth operation period D and the fifth operation period E shown in FIG. 4.

In some example embodiments, in the controlling and determination operation (operation S400), in response to a comparison result that the first target voltage Vt_1 is lower than or equal to the second target voltage Vt_2, the first reference voltage Vref_1 is applied to the first capacitor and the second reference voltage Vref_2 is applied to the second capacitor. Next, in the controlling and determination operation (operation S400), the first pre-charge capacitor is pre-charged based on the first reference voltage Vref_1 and the second pre-charge capacitor is pre-charged based on the second reference voltage Vref_2.

Figure 11:
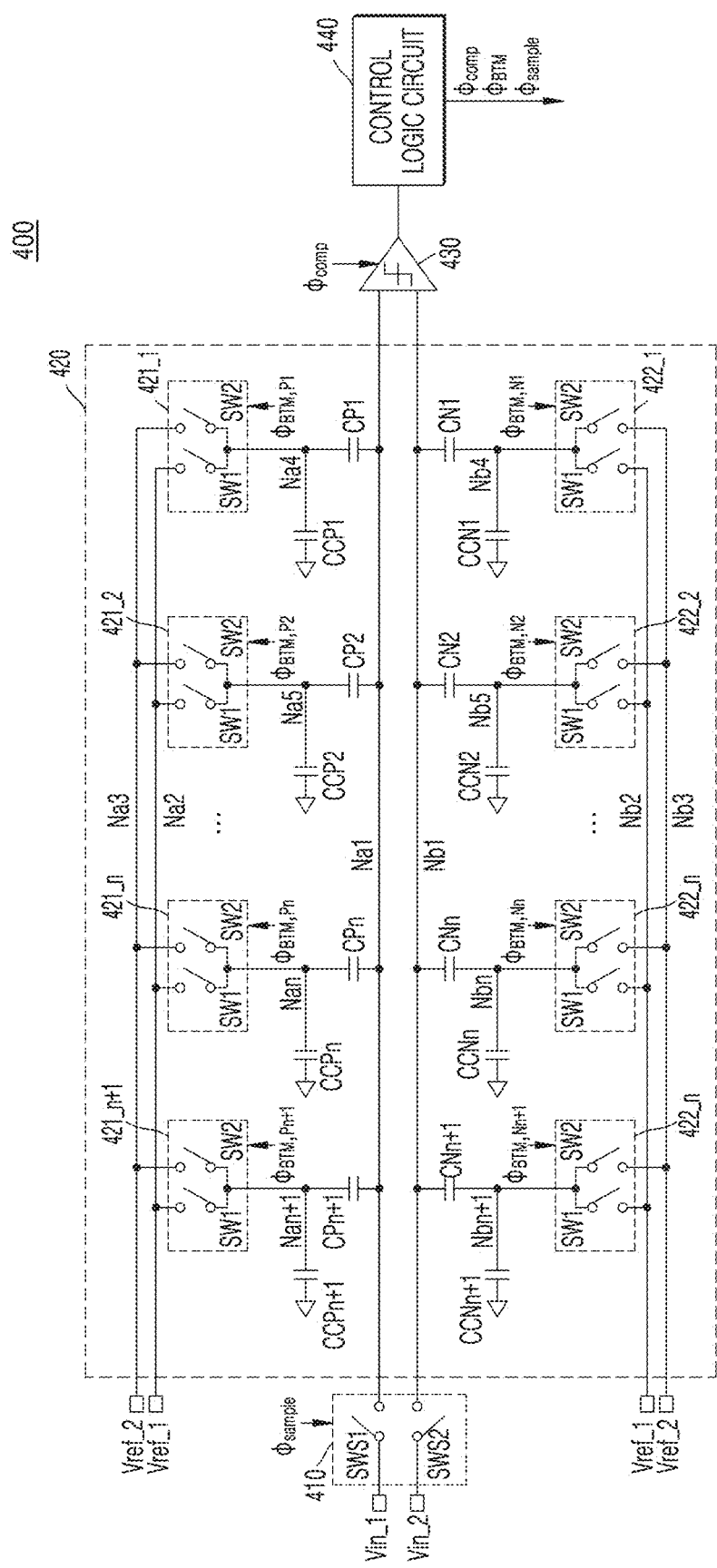
FIG. 11 is an equivalent circuit diagram of an analog-to-digital conversion circuit according to some example embodiments of inventive concepts.

FIG. 11 is an equivalent circuit diagram of an analog-to-digital conversion circuit according to another example embodiment of inventive concepts.

Referring to FIG. 11, an analog-to-digital converter 400 may include a sample/hold circuit 410, a digital-to-analog converter 420, a comparing circuit 430, and a control logic circuit 440. The sample/hold circuit 410 and the comparing circuit 430 are identical to the sample/hold circuit 210 and the comparing circuit 230 described above with reference to FIG. 2.

In some example embodiments, the digital-to-analog converter 420 may include a first sub digital-to-analog converter and a second sub digital-to-analog converter.

The first sub digital-to-analog converter may include the first to n+1-th capacitors CP1, CP2, CPn, and CP+1, first to n+1-th positive reference voltage switches 421_1, 421_2, 421_n, and 421_n+1, and the first to n+1-th pre-charge capacitors CCP1, CCP2, CCPn, and CCPn+1.

The first to n+1-th capacitors CP1, CP2, CPn, and CP+1 and the first to n+1-th positive reference voltage switches 421_1, 421_2, 421_n, and 421_n+1 are identical to those described above with reference to FIG. 2.

The first to n+1-th pre-charge capacitors CCP1, CCP2, CCPn, and CCPn+1 may be connected to a node to which the ground voltage is applied and the first to n+1-th positive filtering nodes Na4, Na5, NAn, and Nan+1. For example, a first terminal of the first pre-charge capacitor CCP1 may be connected to a node to which the ground voltage is applied, and a second terminal of the first pre-charge capacitor CCP1 may be connected to the first positive filtering node Na4.

The second sub digital-to-analog converter may include the first to n+1-th capacitors CN1, CN2, CNn, and CNn+1, first to n+1-th negative reference voltage switches 422_1, 422_2, 422_n, and 422_n+1, and the first to n+1-th pre-charge capacitors CCN1, CCN2, CCNn, and CCNn+1.

The first to n+1-th capacitors CN1, CN2, CNn, and CNn+1 and the first to n+1-th negative reference voltage switches 422_1, 422_2, 422_n, and 422_n+1 are identical to those described above with reference to FIG. 2.

The first to n+1-th pre-charge capacitors CCN1, CCN2, CCNn, and CCNn+1 may be connected to a node to which the ground voltage is applied and the first to n+1-th negative filtering nodes Nb4, Nb5, Nbn, and Nbn+1. For example, a first terminal of the first pre-charge capacitor CCN1 may be connected to a node to which the ground voltage is applied, and a second terminal of the first pre-charge capacitor CCN1 may be connected to the first negative filtering node Nb4.

As in the control logic circuit 240 described above with reference to FIG. 2, the control logic circuit 440 may control the sample/hold circuit 410, the first to n+1-th positive reference voltage switches 421_1, 421_2, 421_n, and 421_n+1, the first to n+1-th negative reference voltage switches 422_1, 422_2, 422_n, and 422_n+1, and the comparing circuit 430.

Figure 12:
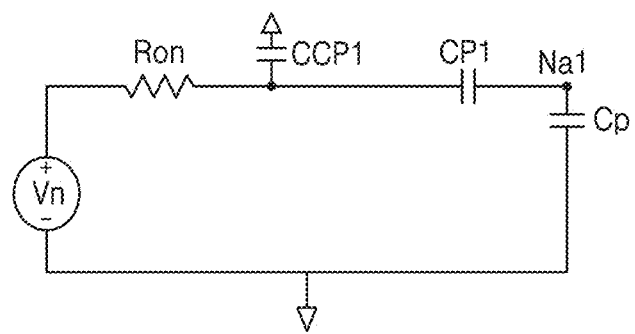
FIG. 12 is an equivalent circuit diagram modeling noise occurring in a sub digital-to-analog converter shown in FIG. 11.

FIG. 12 is an equivalent circuit diagram modeling noise occurring in a sub digital-to-analog converter shown in FIG. 11. In detail, FIG. 12 is a circuit diagram modeling a case in which the first pre-charge capacitor CCP1 included in the first sub digital-to-analog converter is electrically connected to the first positive filtering node Na4.

Referring to FIGS. 11 and 12, thermal noise generated every time the first positive reference voltage switch 221_1 operates, the first capacitor CP1, the first pre-charge capacitor CCP1, and/or the parasitic capacitor $C_P$ may be modeled into a circuit diagram as shown in FIG. 10.

In the circuit diagram shown in FIG. 12, the equivalent capacitance becomes greater than the capacitance of the first pre-charge capacitor CCP1, and thus, the cut off frequency may become sufficiently small to sufficiently block thermal noise. According to some example embodiments described above, an efficiency of comparing analog signals and/or an operation speed may be improved.

However, unlike as shown in FIGS. 5A and 5B, when a comparison operation is performed, the first pre-charge capacitor CCP1 is charged by the first reference voltage Vref_1, a fixing time for the first target voltage Vt_1 of the first comparing node Na1 may be delayed.

The modeling shown in FIG. 12 may also be identically applied to second to n+1-th capacitors CP2, CPn, and CPn+1, the second to n+1-th positive reference voltage switches 221_2, 221_n, and 221_n+1, the second to n+1-th positive pre-charge switches 223_2, 223_n, and 223_n+1, and second to n+1-th pre-charge capacitors CCP2, CCPn, and CCPn+1 and may be identically applied to the second sub digital-to-analog converter.

Figure 13:
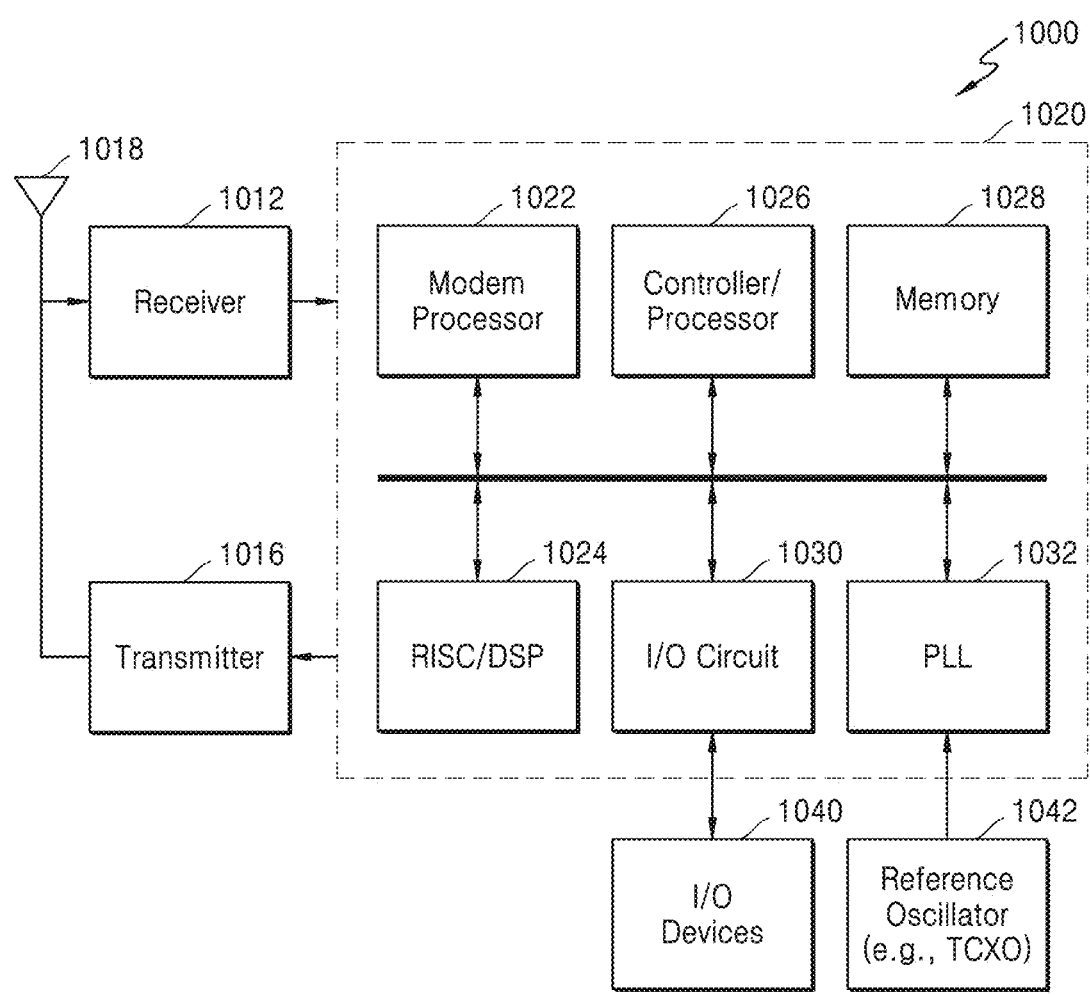
FIG. 13 is a block diagram showing a communication device according to some example embodiments of inventive concepts.

FIG. 13 is a block diagram showing a communication device according to some example embodiments of inventive concepts.

Referring to FIG. 13, a communication device 1000 may include at least one of a receiver 1012, a transmitter 1016, a communication module 1020, an antenna 1018, an input/output device 1040, and a reference oscillator 1042. The receiver 1012 may include the analog-to-digital converter 100 of FIG. 1. The receiver 1012 may convert an analog signal received from the outside through the antenna 1018 into a digital signal by using an analog-to-digital conversion circuit (e.g., 100) and provide the digital signal to the communication module 1020. The transmitter 1016 may convert the digital signal received from the communication module 1020 into an analog signal and output the analog signal to the outside through the antenna 1018.

The communication module 1020 may include at least one of a modem processor 1022, a RISC/DSP 1024, a controller/processor 1026, a memory 1028, an input/output device 1030, and a phase locked loop 1032.

The modem processor 1022 may perform a processing operation for data transmission and/or data reception, e.g., at least one of encoding, modulation, demodulation, and decoding. The RISC/DSP 1024 may perform a common processing operation and/or a processing operation specialized to the communication device 1000. The controller/processor 1026 may control blocks inside the controller/processor 1026. The memory 1028 may store data and various instruction codes. The input/output device 1030 may communicate with the input/output device 1040 outside the communication module 1020. The input/output device 1030 may convert a data signal received from the input/output device 1040 into a digital signal by using the analog-to-digital conversion circuit. The phase locked loop 1032 may perform a frequency modulation operation by using a frequency signal received from the reference oscillator 1042. The reference oscillator 1042 may be implemented as at least one of a crystal oscillator (XO), a voltage controlled crystal oscillator (VCXO), a temperature compensated crystal oscillator (TCXO), etc. The communication module 1020 may perform a processing operation needed or used for communication by using output signals generated by the phase locked loop 1032.

Figure 14:
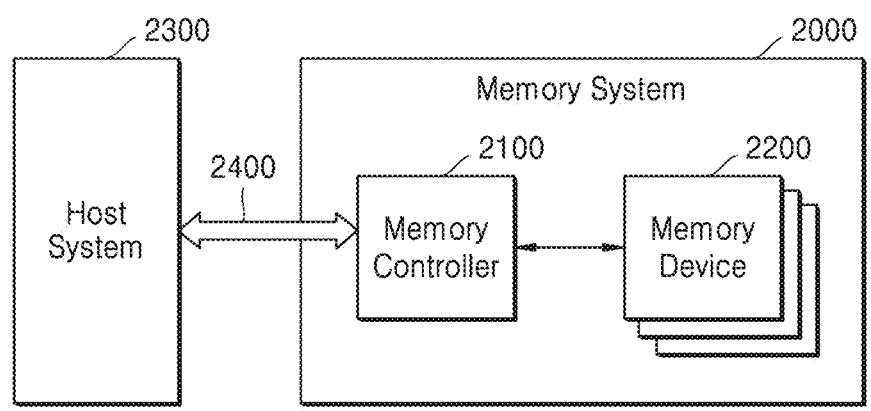
FIG. 14 is a block diagram showing systems according to some example embodiments of inventive concepts.

FIG. 14 is a block diagram showing systems according to some example embodiments of inventive concepts.

Referring to FIG. 14, a memory system 2000 and a host system 2300 may communicate with each other through an interface 2400, and the memory system 2000 may include a memory controller 2100 and memory devices 2200.

The interface 2400 may use electrical signals and/or optical signals and, as a non-limiting example, may be implemented as at least one of a serial advanced technology attachment (SATA) interface, SATA express (SATAe) interface, a serial attached small computer system interface (SCSI) (SAS), an universal serial bus (USB) interface, or a combination thereof. The host system 2300 and the memory controller 2100 may each include a serializer-deserializer SerDes for serial communication.

In some example embodiments, the memory system 2000 may communicate with the host system 2300 by being removably coupled to the host system 2300. The memory devices may be volatile memories or non-volatile memories, and the memory system 2000 may also be referred to as a storage system. For example, as a non-limiting example, the memory system 2000 may be implemented by a solid-state drive or solid-state disk (SSD), an embedded SSD (eSSD), a multimedia card (MMC), an embedded multimedia card (eMMC), etc. The memory controller 2100 may control the memory devices 2200 in response to a request received from the host system 2300 through the interface 2400.

Meanwhile, the analog-to-digital conversion circuit to which example embodiments of inventive concepts are applied may be implemented to be included in each of the memory controller 2100, the memory devices 2200, and the host system 2300. In detail, the memory controller 2100, the memory devices 2200, and the host system 2300 may each receive a PAMn-based data signal and convert the data signal into digital data through a scheme according to various example embodiments of inventive concepts.

Figure 15:
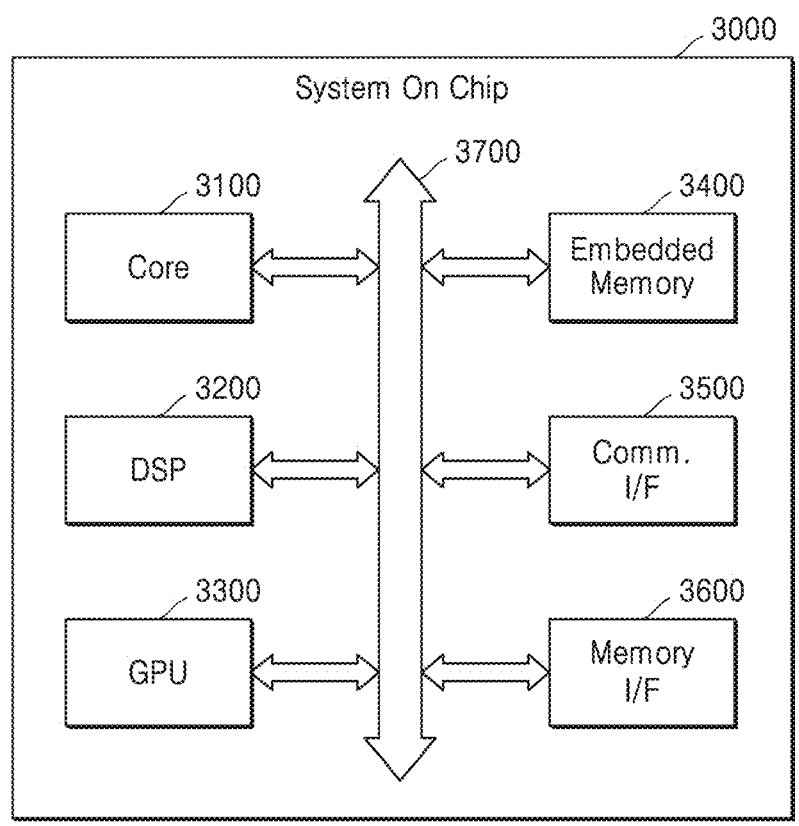
FIG. 15 is a block diagram showing a system-on-chip according to some example embodiments of inventive concepts.

FIG. 15 is a block diagram showing a system-on-chip according to some example embodiments of inventive concepts.

Referring to FIG. 15, a system on chip (SoC) 3000 may refer to an integrated circuit on which parts of a computing system or other electronic systems are integrated. For example, as an example of the SoC 3000, an application processor (AP) may include a processor and parts for other functions.

The SoC 3000 may include a core 3100, a digital signal processor (DSP) 3200, a graphics processing unit (GPU) 3300, an embedded memory 3400, a communication interface 3500, and a memory interface 3600. The components of the SoC 3000 may communicate with one another through a bus 3700.

The core 3100 may process instructions and control operations of the components included in the SoC 3000. For example, the core 3100 may process a series of instructions, thereby driving an operating system and executing applications on the operating system. The DSP 3200 may generate useful data by processing digital signals, e.g., digital signals provided from the communication interface 3500. The GPU 3300 may generate data for images output through a display device from image data provided from the embedded memory 3400 or the memory interface 3600 or encode image data. The embedded memory 3400 may store data needed for operations of the core 3100, the DSP 3200, and the GPU 3300. The memory interface 3600 may provide an interface for at least one of an external memory of the SoC 3000, e.g., a dynamic random access memory (DRAM), a flash memory, etc.

The communication interface 3500 may provide a serial communication between the SoC 3000 and an external device. For example, the communication interface 3500 may access an Ethernet and may include a SerDes for a serial communication.

Meanwhile, the analog-to-digital conversion circuit to which example embodiments of inventive concepts are applied may be applied to the communication interface 3500 or the memory interface 3600. In detail, the communication interface 3500 or the memory interface 3600 may receive a PAMn-based data signal and convert the data signal into digital data through a scheme according to various example embodiments of inventive concepts.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts have been particularly shown and described with reference to various example embodiments thereof, it will be understood that various changes in form and details may be made therein without departing from the spirit and scope of the following claims. Furthermore, example embodiments are not necessarily mutually exclusive with one another. For example, some example embodiments may include features described with reference to one or more figures, and may also include features described with reference to one or more other figures.

What is claimed is:

1. An analog-to-digital converter comprising:
a sample/hold circuit;

a digital-to-analog converter;
a comparing circuit; and
a control logic circuit,
wherein the digital-to-analog converter includes,
   a first capacitor connected to a first comparison node that is connected to a first input terminal of the comparing circuit, the first capacitor connected to a first filtering node,
   a first reference voltage switch configured to operate in response to a control of the control logic circuit to electrically connect the first filtering node to a first delivery node to which a first reference voltage is applied or to electrically connect the first filtering node to a first transmission node to which a second reference voltage is applied,
   a first pre-charge capacitor connected to a ground voltage, and
   a first pre-charge switch configured to operate in response to the control of the control logic circuit to connect the first pre-charge capacitor to one of the first filtering node or to the first delivery node.

2. The analog-to-digital converter of claim 1, wherein the digital-to-analog converter comprises:
   a second capacitor connected to the first comparison node and to a second filtering node;
   a second reference voltage switch configured to operate in response to the control of the control logic circuit to electrically connect the first delivery node to the second filtering node or to electrically connect the first transmission node to the second filtering node;
   a second pre-charge capacitor connected to the ground voltage; and
   a second pre-charge switch configured to operate in response to the control of the control logic circuit to connect the second pre-charge capacitor to one of the second filtering node or the first delivery node.

3. The analog-to-digital converter of claim 2, wherein the first reference voltage switch is configured to electrically connect the first delivery node to the first filtering node during first to third operation periods from among first to fifth operation periods that come sequentially, and
   the second reference voltage switch is configured to electrically connect the first delivery node to the second filtering node during the first operation period, the fourth operation period, and the fifth operation period and is configured to electrically connect the first transmission node to the second filtering node during the second operation period and the third operation period.

4. The analog-to-digital converter of claim 3, wherein the first pre-charge switch is configured to electrically connect the first pre-charge capacitor to the first delivery node during the first operation period, the third operation period, and the fifth operation period and is configured to electrically connect the first pre-charge capacitor to the first filtering node during the second operation period, and
   the second pre-charge switch is configured to electrically connect the second pre-charge capacitor to the first delivery node during the first operation period, the second operation period, the third operation period, and the fifth operation period and is configured to electrically connect the second pre-charge capacitor to the second filtering node during the fourth operation period.

5. The analog-to-digital converter of claim 1, wherein the digital-to-analog converter comprises:
   a second capacitor connected to a second comparison node that is connected to a second input terminal of the comparing circuit, the second capacitor connected to a second filtering node;
   a second reference voltage switch configured to operate in response to the control of the control logic circuit to electrically connect a second delivery node, to which the first reference voltage is applied, to the second filtering node or is configured to electrically connect a second transmission node, to which the second reference voltage is applied, to the second filtering node;
   a second pre-charge switch, which is configured to connect to the second filtering node or to the second transmission node in response to a control of the control logic circuit; and
   a second pre-charge capacitor, which is configured to connect to the second pre-charge switch and the ground voltage.

6. The analog-to-digital converter of claim 5, wherein the first reference voltage switch is configured to electrically connect the first delivery node to the first filtering node during first to third operation periods that come sequentially, and
   the second reference voltage switch electrically is configured to connect the second delivery node to the second filtering node during the first operation period from among the first to third operation periods and to electrically connect the second transmission node to the second filtering node during the second operation period and the third operation period.

7. The analog-to-digital converter of claim 6, wherein the first pre-charge switch is configured to electrically connect the first pre-charge capacitor to the first delivery node during the first operation period and the third operation period and is configured to electrically connect the first pre-charge capacitor to the first filtering node during the second operation period, and
   the second pre-charge switch is configured to electrically connect the second pre-charge capacitor to the second delivery node during the first operation period and the third operation period and is configured to electrically connect the second pre-charge capacitor to the second filtering node during the second operation period.

8. The analog-to-digital converter of claim 7, wherein, during the fourth operation period and the fifth operation period after the third operation period, the first reference voltage switch is configured to connect the first filtering node to the first delivery node and the second reference voltage switch is configured to connect the second filtering node to the second transmission node, or
   the first reference voltage switch is configured to connect the first filtering node to the first transmission node and the second reference voltage switch is configured to connect the second filtering node to the second delivery node.

9. The analog-to-digital converter of claim 1, wherein the digital-to-analog converter further comprises:
   a second pre-charge capacitor connected to the first pre-charge switch and the ground voltage, and
   wherein the first pre-charge switch includes,
      a first charge switch configured to electrically connect the first pre-charge capacitor to the first filtering node or to electrically connect the first pre-charge capacitor to the first delivery node; and
      a second charge switch configured to electrically connect the second pre-charge capacitor to the first filtering node or to electrically connect the second pre-charge capacitor to the first transmission node.

10. The analog-to-digital converter of claim 9, wherein the digital-to-analog converter comprises:
a second capacitor connected to a second comparison node that is connected to a second input terminal of the comparing circuit, the second capacitor connected to a second filtering node;
a second reference voltage switch configured to operate in response to a control of the control logic circuit to electrically connect a second delivery node, to which the first reference voltage is applied, to the second filtering node, or to electrically connect a second transmission node, to which the second reference voltage is applied, to the second filtering node;
a third pre-charge capacitor connected to the ground voltage;
a second pre-charge switch configured to operate in response to a control of the control logic circuit to connect the third pre-charge capacitor to one of the second filtering node or to the second transmission node; and
a fourth pre-charge capacitor connected to the second pre-charge switch and to the ground voltage, and
the second pre-charge switch includes,
a third charge switch configured to electrically connect the third pre-charge capacitor to the second filtering node or to electrically connect the third pre-charge capacitor to the second delivery node, and
a fourth charge switch configured to electrically connect the fourth pre-charge capacitor to the second filtering node or to electrically connect the fourth pre-charge capacitor to the second transmission node.

11. An analog-to-digital converter configured to output a digital signal based on first and second input voltages and first and second reference voltages, the analog-to-digital converter comprising:
a sample/hold driver configured to operate in response to a sample/hold control signal to sample the first and second input voltages and output first and second sampling signals;
a digital-to-analog converter comprising a first sub digital-to-analog converter configured to operate in response to a first reference voltage switch control signal and a first pre-charge switch control signal so as to output a first target signal based on a first sampling signal, the digital-to-analog converter comprising a second sub digital-to-analog converter configured to operate in response to a second reference voltage switch control signal and a second pre-charge switch control signal so as to output a second target signal based on a second sampling signal;
a comparator configured to operate in response to a comparison operation control signal to compare first and second target signals to each other and output a comparison result signal indicating a result of the comparison; and
a controller configured to output the sample/hold control signal, first and second reference voltage switch control signals, first and second pre-charge switch control signals, and the comparison operation control signal, and to output the digital signal,
wherein the first sub digital-to-analog converter includes,
a first reference voltage switch configured to provide a first reference voltage or a second reference voltage according to a logic level of the first reference voltage switch control signal,
a first capacitor configured to receive a reference voltage provided from the first reference voltage switch and the first sampling signal,
a first pre-charge switch configured to provide the first reference voltage or the reference voltage provided from the first reference voltage switch according to a logic level of the first pre-charge switch control signal, and
a first pre-charge capacitor configured to receive a voltage provided from the first pre-charge switch and connected to a ground voltage, and
wherein the second sub digital-to-analog converter includes,
a second reference voltage switch configured to provide the first reference voltage or the second reference voltage according to a logic level of the second reference voltage switch control signal,
a second capacitor configured to receive a reference voltage provided from the second reference voltage switch and the second sampling signal,
a second pre-charge switch configured to provide the first reference voltage or the reference voltage provided from the second reference voltage switch according to a logic level of the second pre-charge switch control signal, and
a second pre-charge capacitor configured to receive a voltage provided from the second pre-charge switch and connected to the ground voltage.

12. The analog-to-digital converter of claim 11, wherein the sample/hold control signal has a first logic level associated with an instruction to turn-on during a first operation period from among first to third operation periods coming sequentially and has a second logic level associated with an instruction to turn-off during the second operation period and the third operation period,
the first reference voltage switch control signal has a first logic level associated with an instruction to provide the first reference voltage during the first to third operation periods,
the second reference voltage switch control signal has the first logic level associated with an instruction to provide the first reference voltage during the first operation period and has a second logic level associated with an instruction to provide the second reference voltage during the second operation period and the third operation period,
the first pre-charge switch control signal has the first logic level associated with an instruction to provide the first reference voltage during the first operation period and the third operation period and has a second logic level associated with an instruction to provide the reference voltage provided from the first reference voltage switch during the second operation period,
the second pre-charge switch control signal has a first logic level associated with an instruction to provide the second reference voltage during the first operation period and the third operation period and has a second logic level associated with an instruction to provide the reference voltage provided from the second reference voltage switch during the second operation period, and
the comparison operation control signal is a pulse-type signal at a turn-on level during the second operation period.

13. The analog-to-digital converter of claim 12, wherein, after the third operation period, the first reference voltage switch control signal has the second logic level, the second reference voltage switch control signal has the first logic level, and the first pre-charge switch control signal and the second pre-charge switch control signal have the first logic level.

14. The analog-to-digital converter of claim 12, wherein, after the third operation period, the first reference voltage switch control signal has the first logic level, the second reference voltage switch control signal has the second logic level, and the first pre-charge switch control signal and the second pre-charge switch control signal have the first logic level.

15. The analog-to-digital converter of claim 12, wherein the first pre-charge switch control signal and the second pre-charge switch control signal have the first logic level after the third operation period.

16. An operating method of an analog-to-digital converter that is configured to output a digital signal based on first and second input voltages and first and second reference voltages, the operating method comprising:
- a sampling and pre-charging operation that samples the first and second input voltages, pre-charges a first pre-charge capacitor based on a first reference voltage, and pre-charges a second pre-charge capacitor based on a second reference voltage;
- a conversion operation that applies a sampled first input voltage and the first reference voltage to a first capacitor, applies a sampled second input voltage and the second reference voltage to a second capacitor, connects the first pre-charge capacitor to the first capacitor, connects the second pre-charge capacitor to the second capacitor, and provides a first target voltage based on the first capacitor and a second target voltage based on the second capacitor;
- a comparison operation that compares the first target voltage and the second target voltage with each other and generates a comparison result signal indicating a result of the comparison; and
- a controlling and determination operation that applies the first and second reference voltages to first and second capacitors and outputting the digital signal.

17. The operating method of claim 16, wherein, in the controlling and determination operation, in response to a comparison result that the first target voltage is greater than the second target voltage, a second reference voltage is applied to the first capacitor and the first reference voltage is applied to the second capacitor.

18. The operating method of claim 17, wherein, in the controlling and determination operation, a connection relationship between pre-charge capacitors and the first and second capacitors is cancelled, the first pre-charge capacitor is pre-charged based on the first reference voltage, and the second pre-charge capacitor is pre-charged based on the second reference voltage.

19. The operating method of claim 16, wherein, in the controlling and determination operation, in response to a comparison result that the first target voltage is less than or equal to the second target voltage, the first reference voltage is applied to the first capacitor and the second reference voltage is applied to the second capacitor.

20. The operating method of claim 19, wherein, in the controlling and determination operation, a connection relationship between the pre-charge capacitors and the first and second capacitors is cancelled, the first pre-charge capacitor is pre-charged based on the first reference voltage, and the second pre-charge capacitor is pre-charged based on the second reference voltage.

\* \* \* \* \*